United States Patent [19]

Yamada

[11] Patent Number: 4,819,231
[45] Date of Patent: Apr. 4, 1989

[54] FRAMING TIMING DETECTION CIRCUIT FOR A CHARACTER CODE BROADCASTING SYSTEM

[75] Inventor: Osamu Yamada, Tokyo, Japan

[73] Assignee: Nippon Hoso Kyokai, Tokyo, Japan

[21] Appl. No.: 895,033

[22] Filed: Aug. 8, 1986

Related U.S. Application Data

[62] Division of Ser. No. 571,573, Jan. 17, 1984, Pat. No. 4,630,271.

[30] Foreign Application Priority Data

Jan. 20, 1983 [JP] Japan ................................ 58-6579
Mar. 31, 1983 [JP] Japan ................................ 58-54002
Sep. 2, 1983 [JP] Japan ................................ 58-160523
Oct. 25, 1983 [JP] Japan ................................ 58-198363

[51] Int. Cl.$^4$ ............................................ H04J 3/26
[52] U.S. Cl. ................................... 370/94; 370/100
[58] Field of Search ..................... 375/115, 1, 118; 370/94, 60, 18, 100

[56] References Cited

U.S. PATENT DOCUMENTS 4,203,070 5/1980 Bowles et al. .
4,590,601 5/1986 Beeman ............................... 375/115

Primary Examiner—Douglas W. Olms
Attorney, Agent, or Firm—Spencer & Frank

[57] ABSTRACT

A random multi-error correcting code having a maximum length block in a packet, for instance a majority logic decodable (272, 190) shortened difference set cyclic code, is used for error correction in a character code broadcasting system. The error correcting ability of this code is increased. The correction is made by decreasing a threshold value, so that the error correcting ability is improved. A framing timing extraction circuit and a phase lock circuit for the framing timing are eliminated, so that the amount of hardware needed is reduced. Preferably, the error correcting code is superposed on the television signal during the vertical blanking period.

13 Claims, 36 Drawing Sheets

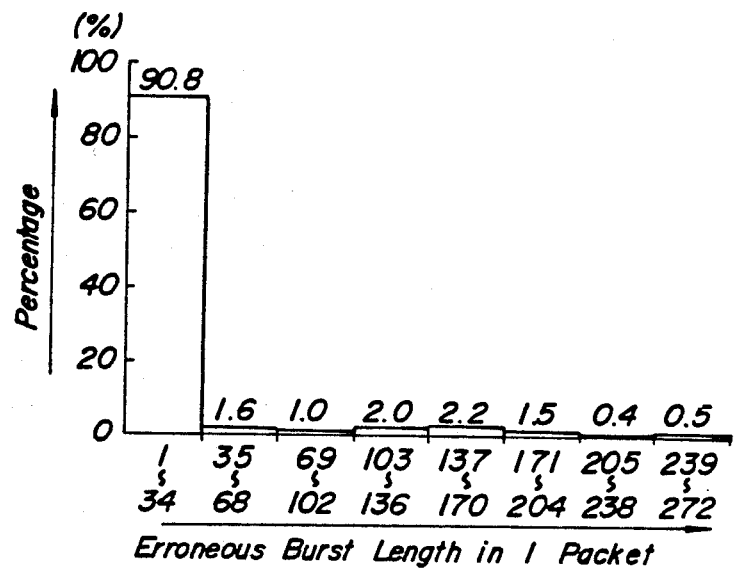
FIG_5
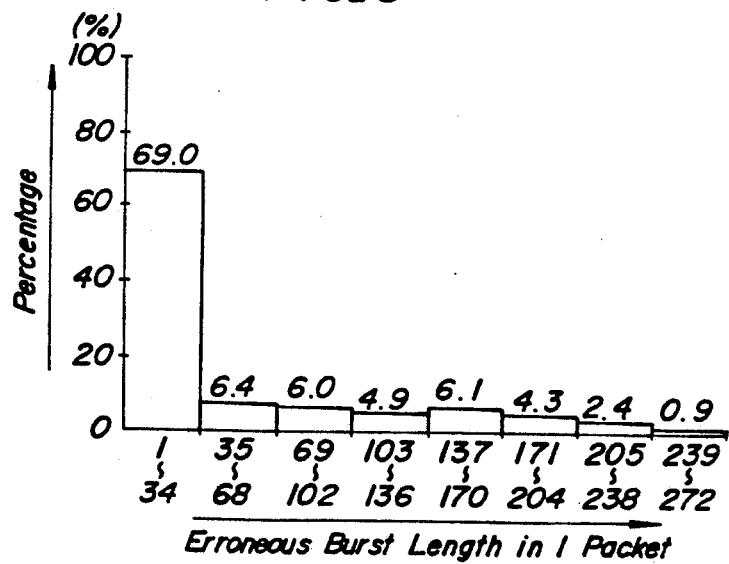
FIG_6

FIG_16
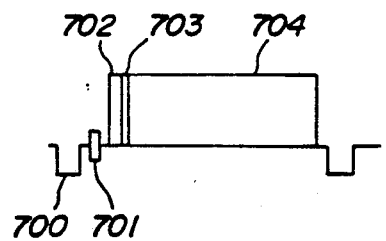
FIG_17
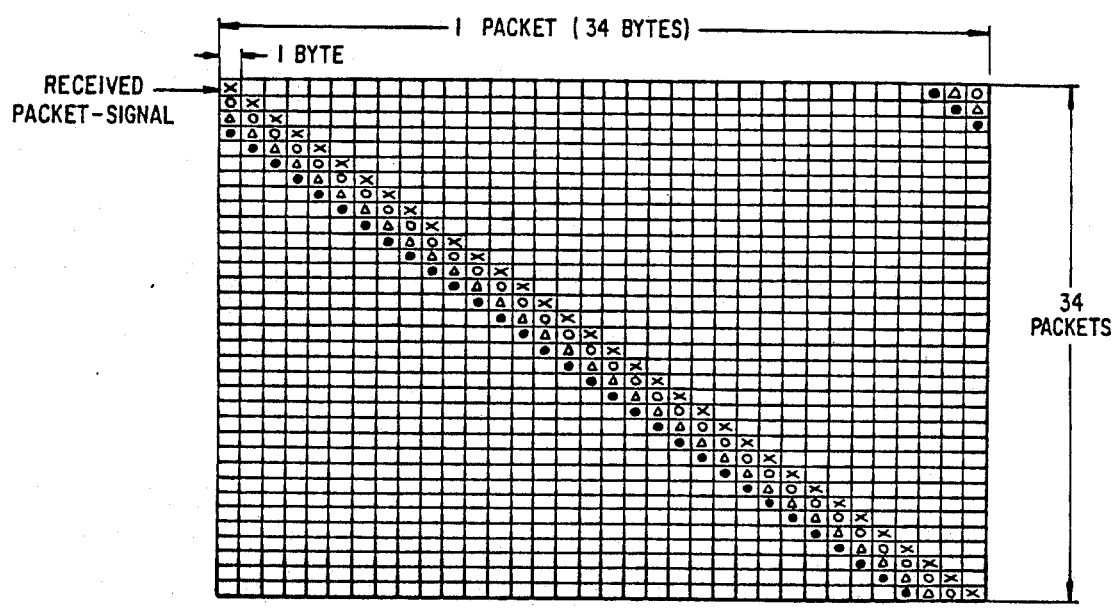

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
| 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |

ADDRESS INVERSION

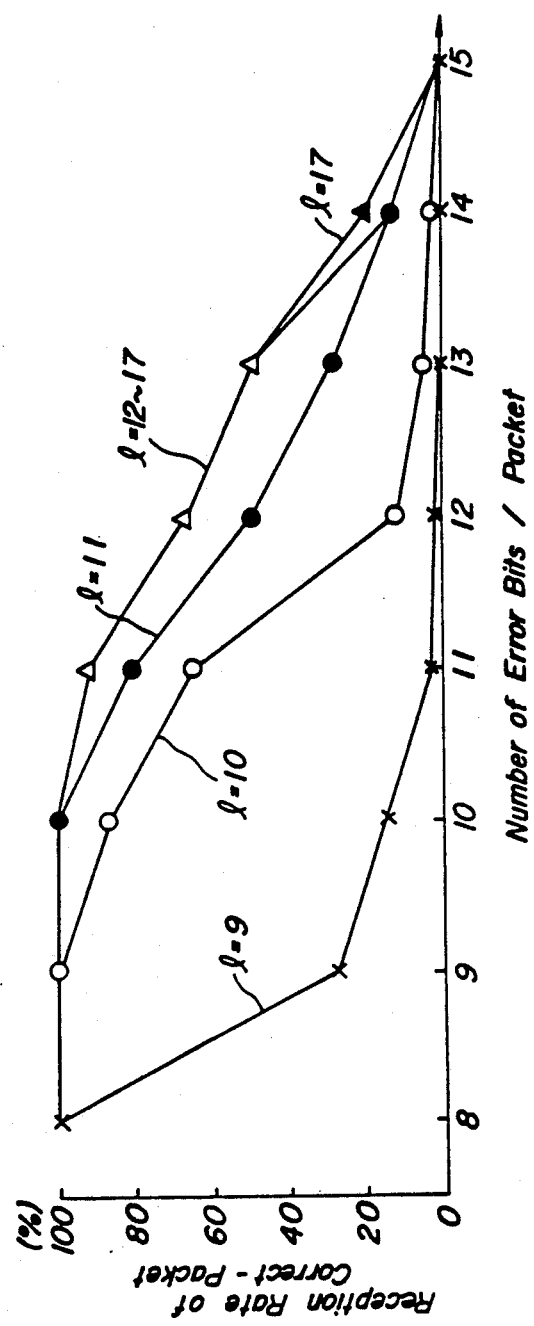

FRAMING TIMING DETECTION CIRCUIT FOR A CHARACTER CODE BROADCASTING SYSTEM

This is a division of application Ser. No. 571,573 filed Jan. 17, 1984, now U.S. Pat. No. 4,630,271.

BACKGROUND OF THE INVENTION

1. Field of the Invention

The present invention relates generally to an error correction method and apparatus adapted for use in a teletext broadcasting system, in which digitally coded characters, patterns or the like are superposed on the televisin signal during vertical blanking periods, and more particularly to an error correction method and apparatus for restoring the coded information as completely as possible by correcting bit errors caused in a transmission path.

2. Description of the Prior Art

The realization of a practical teletext broadcasting system (teletext in Europe and North America) for displaying characters and graphs on the display of an ordinary home-use TV receiver set by using the present TV signal is progressing rapidly in various countries. In this system, the character and graphic information is converted to digital codes and multiplexed with the television signal during the vertical blanking period.

For teletext broadcasting, two methods are being considered. That is, a pattern method that transmits character and graphic information by dissolving the information into dot-patterns, and a code method of teletext broadcasting that transmits character and graphic information by changing the information into codes. The pattern method of teletext broadcasting was established officially as a standard method for teletext broadcasting in Japan in December 1982, after the Report by the Radio Technical Council of Japan was submitted to the Minister of Postal Services. On the other hand, with regard to the code method of teletext broadcasting, it is assumption that this method will maintain compatibility with the pattern method of teletext broadcasting so far developed, and that the code method will also permit various kinds of services in the future using coded signals.

The code method of teletext broadcasting has many merits, such as high transmission efficiency, high system versatility and high expansibility, etc., in comparison with the pattern method of teletext broadcasting. On the other hand, however, it has demerits such as the high price of ROMs to be used in the receiving set character generator. Furthermore if a bit error occurs in the transmission path, erroneous information will be displayed. However, according to recent progress made in LSI technoligies and widespread use of word processors, etc., the ROM price will possibly be reduced by mass production.

In the Japanese character code broadcasting experimental system, which has already been announced, there has long been used the (8, 4) extended Hamming code and the (16, 11) extended Hamming code, in order to correct one bit error in a block including 8 bits or 16 bits. This system is adapted for use with an excellent transmission path in which less bit error is expected. This system, however, cannot sufficiently function to correct errors, if there exist many impulsive noises, so that there exists a bit error during a period of several consecutive bits in one block, or if the transmission path characteristics are so poor that the bit error rate reaches as high as $10^{-2}$.

On the other hand, in the case of error correcting operations for character code broadcasting, the so-called "framing synchronized reproduction" for indicating the start of character codes in a packet is an important problem.

In the proposed system for reproducing the framing timing in a television receiver set, a predetermined bit pattern of a framing code transmitted immediately before the coded characters is detected for determining the framing timing, and thereafter the reception processing is made. With regard to this framing code, it is determined in advance that the distance between the framing code and the clock run in the packet (that is, the number of inconsistent bits between them is equal to or more than three. Therefore, it is possible to correct only one bit error.

However, an actual television transmission path is not satisfactory as a digital data transmission line, so that it is possible that framing code errors are caused by impulsive noise, waveform distortions, ghost interference, etc. Therefore, there has been a disadvantage in that, when receiving framing codes, various countermeasures must be taken by utilizing, for instance, characteristics of the framing code transmitted periodically and exactly.

SUMMARY OF THE INVENTION

It is accordingly a first object of the present invention to provide an error correcting method with a high degree of error correcting ability.

A second object of the present invention is to provide an error correcting and decoding method, in which a random multi-error correcting code suitable for use in the error correction of a character code broadcasting system is employed, and in which digitally coded characters, patterns or the like are multiplexed with the television signal during the vertical blanking periods, whereby a plurality of bit errors are to be corrected.

A third object of the present invention is to provide an error correcting and decoding method, with a high degree of error correcting ability which permits the processing time to be shortened.

A fourth object of the present invention is to provide an error detection circuit, in which the probability of erroneous error correction is minimized for character code broadcasting.

A fifth object of the present invention is to provide a framing timing detection circuit, in which a framing code extraction circuit is eliminated on the receiving side, and it is ensured that the framing timing is reproduced.

In order to achieve the above objects in a broadcasting system for broadcasting character information, an error correction method for correcting an error included in the broadcasted character information according to the present invention comprises the steps of:
selecting a random multi-error correcting code having a maximum length block in a packet;
shortening the random multi-error correcting code by at least one bit;
forming, as a character code signal containing character information, a data signal including a plurality of packets;
multiplying the received data signal as the character code signal by a matrix whose predetermined column all consists of 1 to increase the error correction probability; and decoding character information from the multiplied data signal.

Here, a signal including 273 data-bits consisting of 191 information-bits and 82 parity-bits in the form of a majority logic difference set cyclic code for broadcasting character information may be selected, and the random multi-error correcting code may be shortened by one bit so that 272 data-bits form one packet. In addition, each of the data signals may have 272 data-bits consisting of 190 information-bits and 82 parity-bits.

Alternatively, a signal including 273 data-bits consisting of 191 information-bits and 82 parity-bits in the form of a majority logic difference set cyclic code for broadcasting character information may be selected, and the random multi-error correcting code may be shortened by nine bits so that 264 data-bits form one packet. In this case, each of the data signals may have 264 data-bits consisting of 182 information-bits and 82 parity-bits.

In a broadcasting system having transmitting and receiving sides, an error correcting system for correcting an error in a transmission path between the transmitting and receiving sides according to the present invention comprises:

in the transmitting side;

means for generating a random multi-error correcting code having a maximum length block in a packet;

means for shortening the random multi-error correcting code by at least one bit; and means for forming a data signal including a plurality of packets.

means for transmitting the data signal; and in the receiving side:

means for receiving the transmitted signal;

means for multiplying the transmitted data signal by a matrix whose predetermined column all consists of 1 to increase the error correction probability; and means for decoding information from the multiplied data signal.

In this error correcting system, the means for generating the random multi-error correcting code may comprise means for generating a signal including 273 data-bits consisting of 191 information-bits and 82 parity-bits in the form of a majority logic difference set cyclic core. The means for shortening the random mulit-error correcting code may comprise means for shortening the signal by one bit to provide one packet containing 272 data bits. The means for forming the data signal may be comprise means for forming a data signal including a plurality of packets, of which each has 272 data-bits consisting of 190 information-bits and 82 parity-bits.

Alternatively, the means for generating the random multi-error correcting code may comprise means for generating a signal including 273 data-bits consisting of 191 information-bits and 82 parity-bits in the form of a majority logic difference set cyclic code. The means for shortening the random multi-error correcting code may comprise means for shortening the signal by nine bits to provide one packet containing 264 data bits. The means for forming the data signal may comprise means for forming a data signal including a plurality of packets, of which each has 264 data-bits consisting of 182 information-bits and 82 parity-bits.

Here, it is preferable that there are provided means for idling and cycling the data signal by one bit and means for receiving the information bits and for cycling the received information by a plurality of bits, so that in response to the condition of the syndrome output with respect to the majority logic differential set cyclic code, errors in 9 bits or more than 9 bits per one packet can be corrected by the cylcing means.

An error correction system according to the present invention may preferably comprise:

a syndrome register for receiving the parity bits;

a data register for receiving the information bits;

means for receiving the output from the syndrome register to deliver a majority decision of the output;

means for applying the output from the majority decision logic means to the syndrome register to correct syndrome; and means for adding the output from the majority decision logic means to the output from the data register to derive decoded information.

Here, it is preferable that the information in one packet is divided into a plurality of groups, each consisting of a plurality of bits, so that the plurality of groups are transmitted by separate packets. There may be provided a memory having a storage capacity of information for 34 packets, and being accessed in accordance with a predetermined algorithm when a packet signal is written into or read out from the memory, to obtain a packet signal having a standard arrangement.

According to another aspect of the present invention, an error correction system comprises:

a syndrome register for receiving parity bits;

a data register for receiving information bits;

means for receiving the output from the syndrome register to deliver a majority decision of the output;

a subtraction circuit provided in the majority decision logic circuit;

means for setting a decision threshold value of the majority decision logic circuit at a predetermined value within the number of input elements to the majority decision logic circuit; and means for controlling the subtraction circuit in a manner that after a cyclic correction, a predetermined value is sequentially subtracted from the decision threshold value by the subtraction circuit until the decision threshold value reaches a predetermined value, so that the decoding is effected with correction.

Here, it is preferable that with a signal consisting of 272 bits (a 190-bit information signal and an 82-bit parity signal), is used, the decision threshold value of the majority decision logic circuit is preset at 17 and the specific number is et at 1, in a manner that the decision threshold value 17 is sequentially decreased until it reaches 9 to effect the correction and decoding.

In this aspect of the present invention, the setting of the decision threshold value may be modified in response to an instruction from an exterior device. The setting of the decision threshold value and the re-loading of data can be executed by hardward so that the error processing time period is shortened while the softward burden is decreased.

The decision threshold value may sequentially be decreased by 2 or 3 so that the error correction time is reduced.

The decision threshold value may be started from 13 so that the error correction time is shortened.

An error detection circuit for a character code broadcasting system of the type utilizing an error decoding system using a majority decision difference set cyclic code, according to the present invention, comprises:

syndrome register means for storing input information to perform cyclic correction;

means for counting the number of error correction bits from the syndrome register during the cyclic correction; and means for deciding that an error is detected when the counted value reaches a predetermined value, even if the contents of the syndrome register are all set to zero, whereby an erroneous display of characters is minimized.

Here, the predetermined value can be varied in response to external reception conditions.

A framing timing detection circuit according to the present invention comprises:

first means for receiving a transmitted signal in which a pseudo random signal is added to a predetermined range of a packet signal for character code broadcasting;

second means for receiving the transmitted signal and for adding specific signals to the leading and trialing ends thereof;

third means for executing a predetermined arithmetic operaton to a predetermined range of the signal added with the specific signal;

fourth means for shifting a specific time point of the signal added with the specific signal by the second means by one bit sequentially; and fifth means for retrieving a timing at which the number of error bits is minimized, whereby the detection of a framing timing is ensured.

In this framing timing detection circuit, it is preferable that specific signals are added to the leading and trailing ends of the received transmitted signal in which the exclusive OR result of the pseudo random signal is obtained in the portion succeeding a predetermined time point of the packet signal for character code broadcasting, and the exclusive OR operation of the pseudo random signal is effected in the portion succeeding to the predetermined time point of the signal added with the specific signals.

Also, it is preferable that on the transmission side the transmitted signal is formed by adding the pseudo random signal to the signal obtained by removing four bytes of a clock-run-in signal, a framing code signal, a service discrimination signal and an interrupt signal from the packet signal for character code broadcasting, in addition to a predetermined packet signal consisting of 34 bytes, each one byte is added to the leading and trailing ends of the packet signal, and on the reception side one packet signal is formed by sequentially shifting the leading bit of the received packet signal and the error correction of the one packet signal is effected by a (272,190) error correction circuit, so that a timing at which the error of the one packet signal is corrected is obtained as the framing timing.

In this framing timing detection circuit, the shift number alrady determined can be stored, and thereafter a packet signal which is determined in response to the determined shift number can immediately be loaded into the error correction circuit. Here, it is preferable that the number of shifts which has been already determined is stored per one horizontal scan, so that the framing timing is detected even when the phases of the transmitted signals are varied in respective horizontal scans. In the case that the errors of a packet signal are not corrected by a predetermined number of shifts, a framing timing may be determined within a minimum time period in response to a predetermined algorithm.

BRIEF DESCRIPTION OF THE DRAWINGS

FIG. 5 is a frequency rate diagram illustrating a distribution of error burst lengths in one packet in an area adversely affected by impulsive noise;

FIG. 6 is a frequency rate diagram illustrating a distribution of error burst lengths in one packet in an area where waveforms are distorted;

FIG. 16 is a waveform illustrating an example of a packet signal used in a character code broadcasting system;

FIG. 17 shows an example of a packet signal in accordance with the present invention;

FIG. 18 shows another example of a packet signal in accordance with the present invention;

FIG. 20 is a diagram showing an example of a ROM for decoding a scrambled signal in the case of the fourth example of a packet signal in which inverted information in each byte of information is added to the signal as shown in FIG. 19;

FIG. 27 is a diagram showing correct packet reception rates after error correction obtained by computer simulation;

DETAILED DESCRIPTION OF THE PREFERRED EMBODIMENTS

Figure 1:
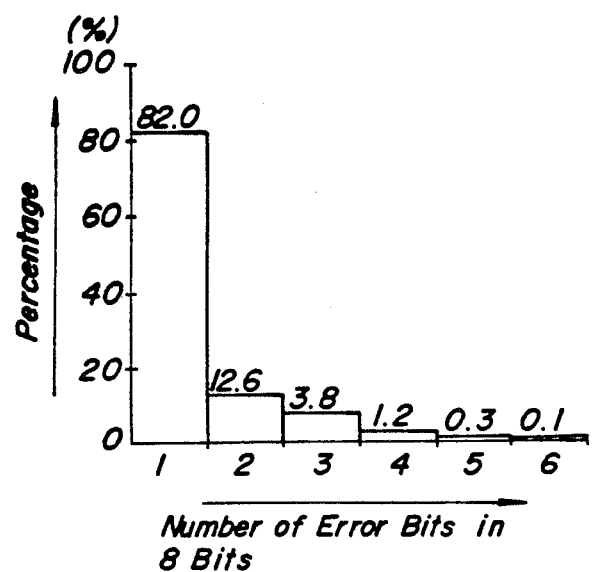
FIG. 1 is a frequency rate diagram illustrating an example of a distribution of average error bit numbers in the received data obtained in field tests.

First of all, the characteristics of error bits in a TV transmission path will be described. FIG. 1 shows the mean values of the numbers of error bits in a byte (eight bits) when the data signal was transmitted in outdoor experiments and received in an impulsive noise area. As shown in FIG. 1, erroneous bytes had one-bit takes errors about 85% of the time so that it is seen that the correct effect will not reach by digit, when the (8, 4) extended Hamming code is used. This code can correct one bit and detect two error bits (what is called SEC-DED; Single Error Correction and Double Error Detection).

Figure 2:
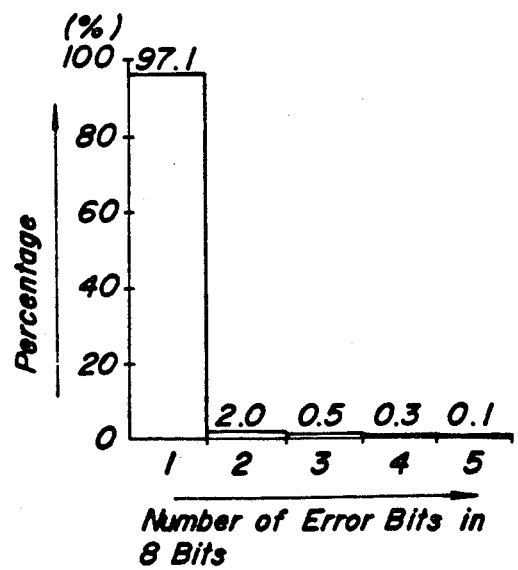
FIG. 2 is a frequency rate diagram illustrating a distribution of error bit numbers, when the transmitted and received signal is interleaved in outdoor experiments.

FIG. 2 shows a distribution similar to that shown in FIG. 1, when the signal was transmitted in the form of an interleaved arrangement and the received signal is deinterleaved. As shown in FIG. 2, the one-bit error rate was about 97.1%. In this case, the correction effect will not reach by two digits. Furthermore, in both the standard arrangement and interleaved arrangement, the efficiency is low and reaches only 50%. When the (16, 11) extended Hamming code which is capable of correcting one bit and detecting two error bits in 16 bits; SEC-DED) is used, the efficiency is improved to 68.7% as compared with the (8, 4) Hamming code. However, the block error rate is not improved.

Figure 3:
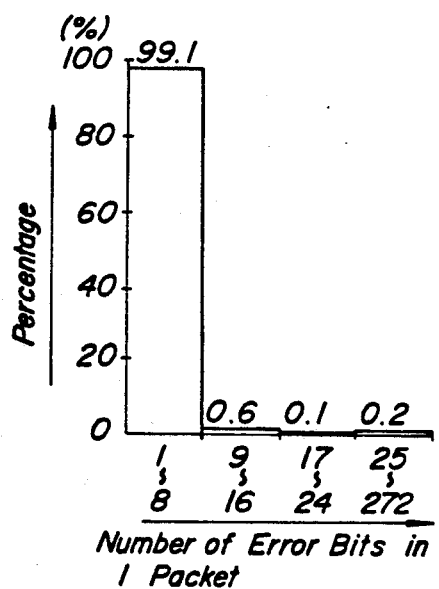
FIG. 3 is a frequency rate diagram illustrating a distribution of error bit numbers in one packet.

Next, the distribution of the number of error bits in one packet will be investigated. FIG. 3 shows that bit errors including 1 through 8 bits reached 99.1% in the impulsive noise area.

Figure 4:
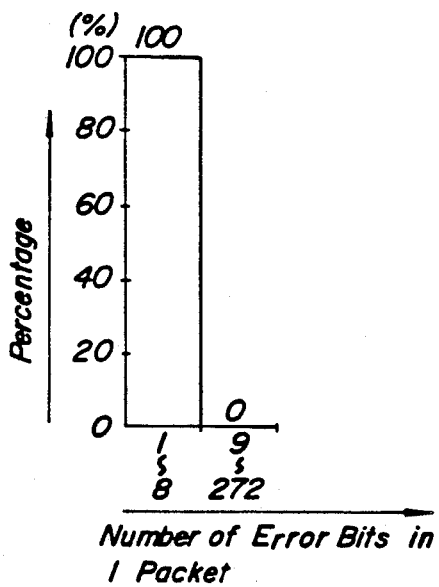
FIG. 4 is a frequency rate diagram illustrating a distribution of error bit numbers in one packet in an area where waveforms are distorted.

In a waveform distortion area, all error bits include 1 through 8 bits as shown in FIG. 4.

FIGS. 5 and 6 show the distributions of the error burst lengths (which means the bit length from the first error bit to the last error bit, regardless of the number of error bits between them) in the impulsive area and the waveform distortion area, respectively.

Even if a code which is capable of correcting 68 bits burst errors is used, an improvement of one digit is effected in an impulsive noise area because of about 92 (90.8+1.6)% as shown in FIG. 5, while the improvement of one digit cannot be effected in the waveform distortion area because of about 75 (69.0+6.4)% as shown in FIG. 6.

Therefore, more improvements in error correction cannot be expected, when a burst error correction code such as a shortened interleaved cyclic code is used.

Figure 7:
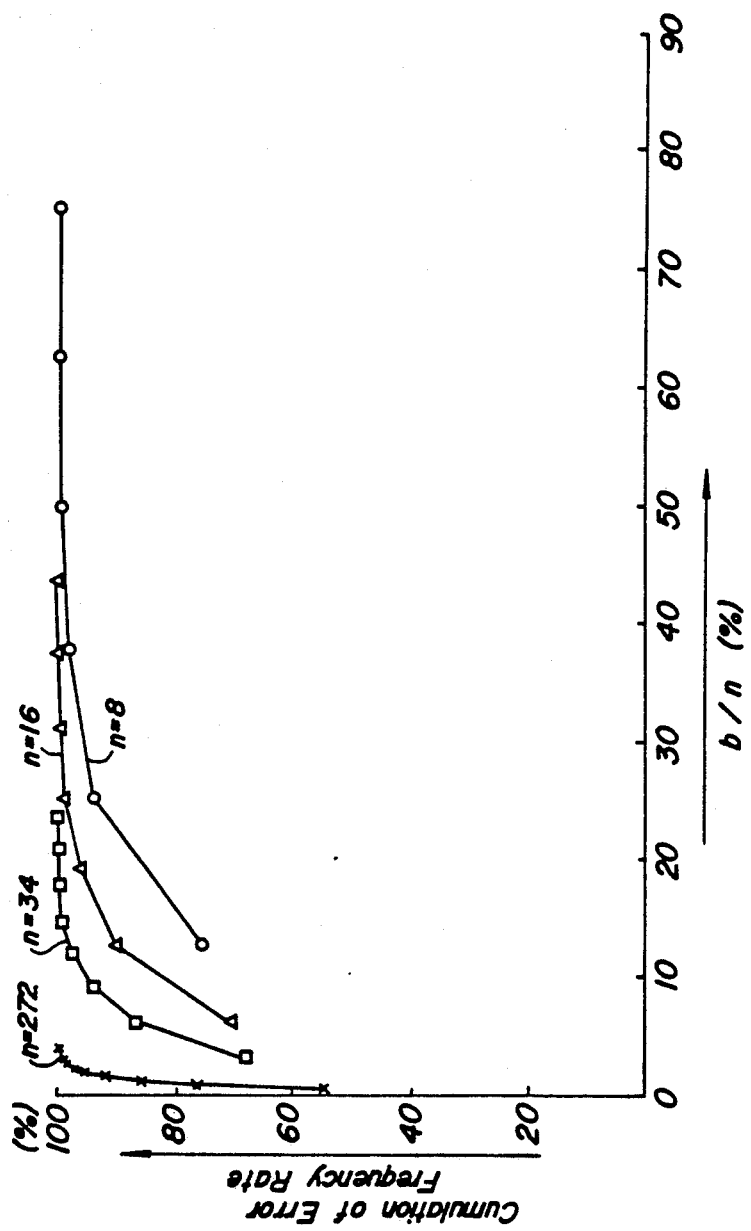
FIG. 7 is a diagram showing a cumulative distribution of frequency rates of error blocks with respect to b/n (%) in an area adversely affected by impulsive noise.
Figure 8:
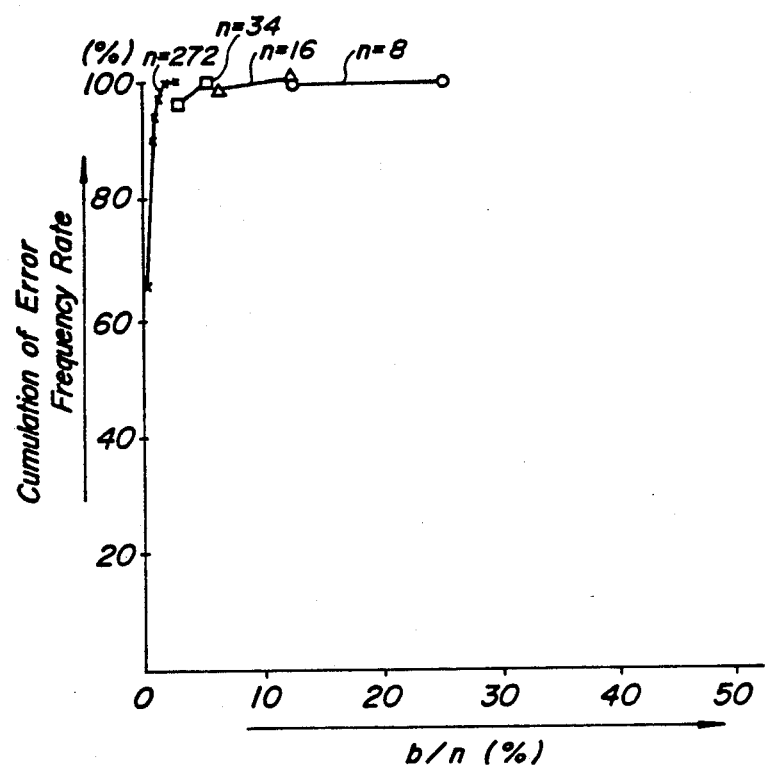
FIG. 8 is a diagram showing a cumulative distribution of frequency rates of error blocks with respect to b/n (%) in an area in which waveforms are distorted.

FIGS. 7 and 8 show the cumulative distributions of error frequency rate in the impulsive noise area and waveform distortion area, respectively. In FIGS. 7 and 8, the parameter b/n (where n=the length of one block and b=the number of error bits in one block) is used. It is seen that it would be advantageous for the correction to be made by using a long block. That is, when the block length is eight (n=8) as shown in FIG. 7, b/n reaches 0.7; that is, six bits in eight bits must be all corrected in order to correct all error blocks. However, it is impossible to attain such correction while maintaining a certain degree of efficiency.

On the other hand, when the block length n=272 (the length of one packet in the case of character code broadcasting), all the errors can be corrected with b/n=0.04. As shown in FIG. 8, it is also seen that all the errors can be corrected with n=272 and b/n=0.03 in the wave-distortion area.

In view of the above, it is seen from the standpoint of error correcting ability that the longer the block length, the more advantageous it is to correct one packet as one block, and the more advantageous it would be to realize this scheme.

Table 1 shows the evaluation of four typical error correction codes, with respect to correction ability, efficiency, scale of hardware (algorithm), simultaneous processing of correction and detection of errors and adaptability to the packet signal.

TABLE 1

|  | correction ability | efficiency | scale of hardware (algorithm) | simultaneous capability of error correction and error detection | adaptability to packet signal |
| --- | --- | --- | --- | --- | --- |
| BCH Code | ◯ | ◯ | X | ◯ | ◯ |
| shortened | △ | ◯ | ◯ | X | ◯ |

TABLE 1-continued

| | correction ability | efficiency | scale of hardware (algorithm) | simultaneous capability of error correction and error detection | adaptability to packet signal |
|---|---|---|---|---|---|
| cyclic code majority logic decodable code | ◯ | △ | ◯ | ◯ | ◯ |
| convolution code | ◯ | ◯ | ◯ | ◯ | X |

◯: better,
△: good,
X: poor

Referring Table 1, it is seen that the majority logic decodable code has the highest evaluation and fewest defects so that it is most adaptable for use in error correction during character code broadcasting.

Various types of majority logic decodable codes have been invented, but in view of the compatibility with the pattern method of character broadcasting, the (272,190) code, which is obtained by reducing one bit from the (273,191) difference set cyclic code (1 packet=272 bits), is best adapted for the Japanese character code broadcasting. This code has an efficiency R, where efficiency $R = 190/272 = 0.70$.

In considering the error correcting ability, 8-bit random errors in one packet can be corrected. From FIGS. 3 and 4, an error correction efficiency of 99.1% is expected in the impulsive noise area, while a correction efficiency of 100% is expected in the waveform distortion area. Thus, the present invention uses their error correcting code.

Next, the underlying principle of this code will be described. First, the majority logic decodable code will be described. Let us assume the most simple example of the M-sequence code with a code length of 7, and an information digit of 3. The parity check matrix H of this code is given by.

$$H = \begin{bmatrix} 1 & 0 & 1 & 1 & 0 & 0 & 0 \\ 1 & 1 & 1 & 0 & 1 & 0 & 0 \\ 1 & 1 & 0 & 0 & 0 & 1 & 0 \\ 0 & 1 & 1 & 0 & 0 & 0 & 1 \end{bmatrix}$$

Let e denote the vector representative of noise; that is, $e = (e_0, e_1, \ldots, e_6)$ and let S represent sybndrome; that is, $S = (S_0, S_1, S_2, S_3)$ Then $S = eH^T$ where, T indicates the transition of the vector.

The composite parity checks $A_1$, $A_2$ and $A_3$ consisting of $S_1$, $S_2$ and $S_1 + S_3$ are given as follows:

$A_1 = S_0 = e_0 + e_2 + e_3$ $A_2 = S_3 = e_0 + e_1 + e_5$ $A_3 = S_1 + S_2 = e_0 + e_4 + e_6$

It is seen that $e_0$ is included in all of $A_1$, $A_2$ and $A_3$, while $e_1$ through $e_6$ are included in only one of $A_1$, $A_2$ and $A_3$. In this case, $A_1$, $A_2$ and $A_3$ are referred to be "orthogonal with respect to $e_0$".

Assume that $e_0$ has an error, then $A_1 = A_2 = A_3 = 1$. When one of $e_1$ through $e_6$ is erroneous, one of $A_1$, $A_2$ and $A_3$ becomes 1. Therefore, when the threshold value of $A_1$, $A_2$ and $A_3$ is determined as 2 (or 3), the output from a majority logic circuit can correct the error bit $e_0$. Since the M-sequence code is a cyclic code, when the above-described operation is repeated 7 times, one bit in 7 bits can be corrected without fail.

Figure 9:
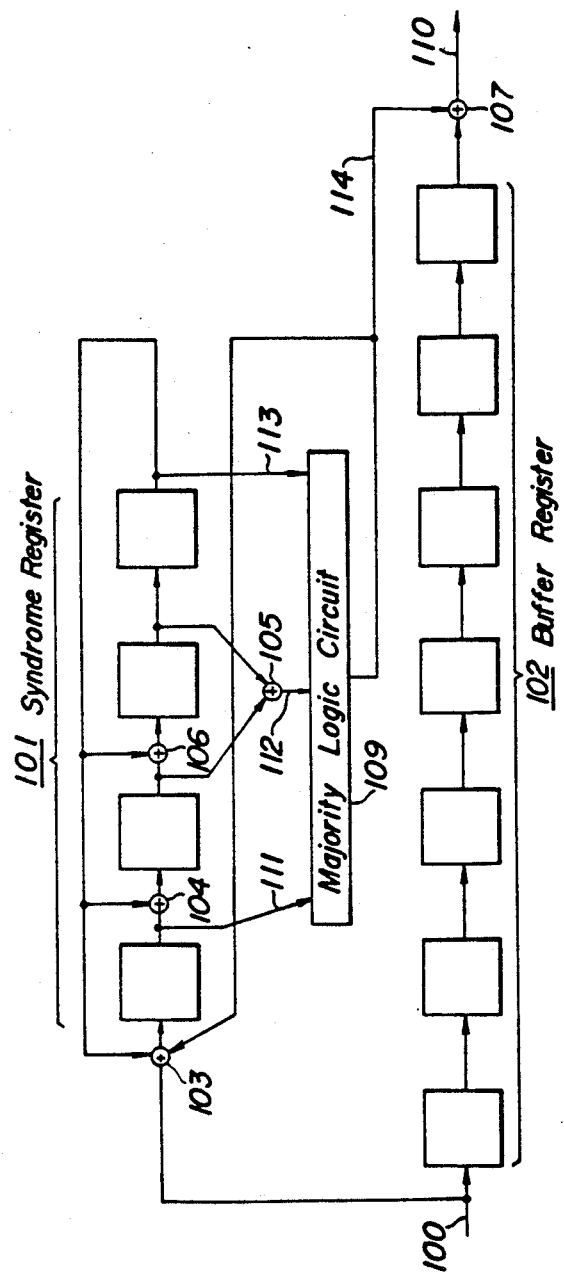
FIG. 9 is a block diagram of an example of an error correcting and decoding circuit.

FIG. 9 shows an example of an error correction circuit for carrying out the above-described error correcting operation. Reference numeral 100 denotes a 7-bit input signal. A syndrome register 101 is initially set to "0". Reference numeral 102 denotes a buffer register for temporarily storing the input data 100. Until the input signal 100 is completely entered into all the buffer registers 102, the same data are loaded in the syndrome register 101. In this case, a majority logic circuit 109 is not enabled. Reference numerals 103 through 107 denote modulo-two adders.

When all the 7-bit data have been completely entered into the registers 101 and 102, the error correcting operation is started. That is, the majority logic circuit or majority decision circuit 109 is enabled. Three inputs 111, 112 and 113 are applied to the majority logic circuit or majority decision circuit 109. When two or three inputs of these three inputs are "1"s, the output 114 from the majority logic circuit 109 becomes "1" in response to which an error bit is corrected in the adder 107.

Simultaneously, in order to remove the adverse effect on the syndrome due to the error bit, the syndrome register 101 is modified in response to the output 114. Whether the error is completely corrected or not is detected by this operation. That is, if all the errors have been corrected upon completion of the operation for correcting every bit, the contents in the syndrome register 101 are all "0". If the contents in the syndrome register 101 are not "0", the decision is made that proper correction has not been accomplished. In this case, the generator polynomial is given as follows:

$G(x) = X^4 + X^2 + X + 1$

When the leading bit of the buffer register 102 is erroneous and then corrected, this correction corresponds to $X^7$ bit. It follows therefore that the effect to the syndrome register 101, due to $X^7$, is given by $$\{X^7/G(x)\}=1$$

Where, the symbol { } represents the residue class. Therefore, in response to the output 114, a bit for modify the syndrome is needed.

Next, the case of the actual transmission of data will be described. The generator matrix is given by $$G = \begin{bmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{bmatrix}$$

In response to the three-bit information 001, the code C is given by $$C=(001)\ G=0010111$$

When this code is transmitted without any error, the contents of the syndrome at the receiving side becomes naturally 0000. The contents in the syndrome register 101 changes as follows:
0100: the first, second, third and fourth bits are loaded.
1010: the first through fifth bits are loaded.
1101: the first through sixth bits are loaded.
0000: the first through seventh bits are loaded.
As described above, the contents of the syndrome register 101 become 0000, so that every information without any error is derived from an output terminal 110.

Next, let us investigate the case where the second bit is erroneous. In this case, the received data are 0110111. Therefore, the syndrome $S(x)$ is given by $$S(X) = \left\{ \frac{X^5 + X^4 + X^2 + X + 1}{G(X)} \right\}$$
$$= X^3 + X^2 + X$$

The contents of the syndrome register 101 becomes

0111.

Next, let us investigate the operation of the error correction.

| syndrome register 101 | majority logic input 1 | majority logic input 2 | majority logic input 3 | majority logic output | corrected bit |
|---|---|---|---|---|---|
| 0111 | 0 | 0 | 1 | 0 | |
| 1101 | 1 | 1 | 1 | 1 | second bit |
| 0000 | 0 | 0 | 0 | 0 | |

Thus, the second bit can be corrected.

Next, the reason why the present invention selects the (273,191) majority logic decodable code will be described. The conventional majority logic decodable codes are the maximum length sequence code, the Hamming code, the Euclidian geometry code, the finite projective geometry code and the difference set cyclic code etc. In these codes, the maximum length sequence code, the Hamming code and the Euclidian geometry code are in the form of $2^m-1$. In order to make one packet as one block, $m=9$ and $n=511$, then 239 bits must be shortened until $n=272$. But, the transmission efficiency is remarkably decreased by this shortening.

In the case of the finite projective geometry code, n can be attained to $(2^{ms}-1)/(2^s-1)$. But, any code, which can be shortened so that error bits more than 8 bits in one packet may be corrected and the efficiency exceeds than 190/272, cannot be obtained.

The (273,191) majority logic decodable code can be derived from the difference set cyclic code. The differences among the integers 0, 18, 24, 46, 50, 64, 103, 112, 115, 126, 128, 159, 166, 167, 186, 196 and 201 are all different from each other. The generator polynomial of this code is given by $$G(X)=X^{82}+X^{77}+X^{76}+X^{71}+X^{67}+X^{66}+X^{56}+X^{52}+X^{48}+X^{40}+X^{36}+X^{34}+X^{24}+X^{22}+X^{18}+X^{10}+X^4+1.$$

Figure 10:
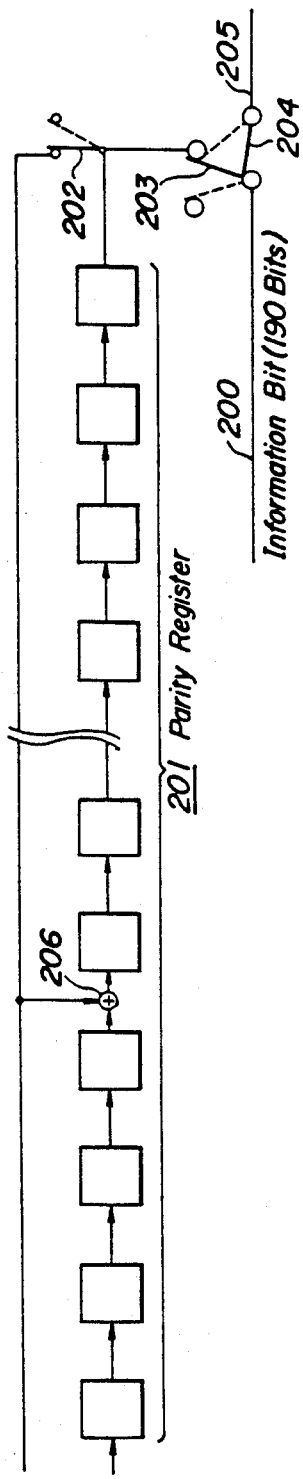
FIG. 10 is a block diagram showing one embodiment of a signal transmission circuit used for carrying out the present invention.

The inputs $A_1$ through $A_{17}$ applied to the majority logic circuit or the majority decision circuit are given by $A_1=S_{10}+S_5$ $A_2=S_{64}$ $A_3=S_{76}+S_{58}$ $A_4=S_{60}+S_{54}+S_{36}$ $A_5=S_{78}+S_{56}+S_{50}+S_{32}$ $A_6=S_{65}+S_{61}+S_{39}+S_{33}+S_{15}$ $A_7=S_{46}+S_{29}+S_{25}+S_3$ $A_8=S_{73}+S_{37}+S_{20}+S_{16}$ $A_9=S_{79}+S_{70}+S_{34}+S_{17}+S_{13}$ $A_{10}=S_{71}+S_{68}+S_{59}+S_{23}+S_6+S_2$ $A_{11}=S_{80}+S_{69}+S_{66}+S_{57}+S_{21}+S_4+S_0$ $A_{12}=S_{51}+S_{49}+S_{38}+S_{35}+S_{26}$ $A_{13}=S_{75}+S_{44}+S_{42}+S_{31}+S_{28}+S_{19}$ $A_{14}=S_{81}+S_{74}+S_{43}+S_{41}+S_{30}+S_{27}+S_{18}$ $A_{15}=S_{63}+S_{62}+S_{55}+S_{24}+S_{22}+S_{11}+S_8$ $A_{16}=S_{72}+S_{53}+S_{52}+S_{45}+S_{14}+S_{12}+S_1$ $A_{17}=S_{77}+S_{67}+S_{48}+S_{47}+S_{40}+S_9+S_7.$ FIG. 10 shows a signal transmission circuit in a transmitting facility. Reference numeral 200 represents an information of 190 bits, and is derived from the original code by reducing one bit. Therefore, the information section comprises 190 bits. An 82-bit parity register 201 (which may be implemented, for example, in a MMI Programmable Logic Array Model 20×10) is initially set to "0", and switches 202, 203 and 204, are initially shifted to the positions indicated by the solid lines. The information 200 is transmitted through the switch 204, and is derived as a transmitted packet signal 205. Simultaneously, the information 200 is transmitted through the switches 202, 203, and an adder 206, whereby a parity bit is generated in accordance with Equation (1). After all the information 200 has been transmitted, the contents in the parity register 201 are transmitted as parity bits. Therefore, from this time point, the switches 202, 203 and 204 are shifted to the positions as indicated by the broken lines, so that the contents or signal in the parity register 201 is derived as a transmitted packet signal 205. In this manner, one packet signal (272,290) is transmitted in the order of the information bits and the parity bits.

Figure 11:
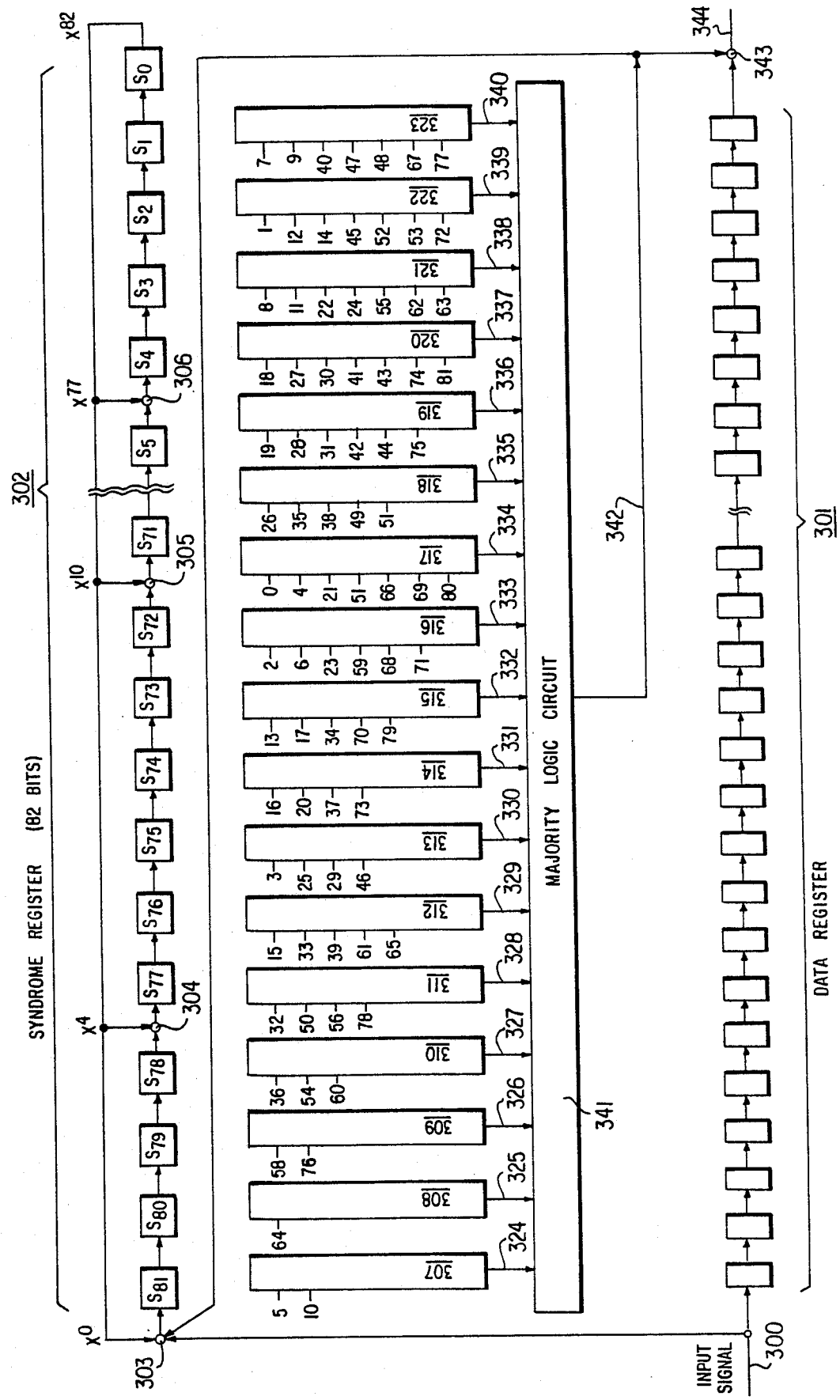
FIG. 11 is a block diagram showing another embodiment of an error correcting and decoding circuit in accordance with the present invention.

FIG. 11 shows a decoding circuit in accordance with the present invention. Reference numeral 300 represents an input signal (that is, the received signal), whose errors must be corrected. Bit "0" is added to the leading end of this input signal, thus one bit which has been shortened when transmitted is added. Therefore, the input signal comprises 273 bits. Except for this fact, the construction is substantially similar in principle to that as shown in FIG. 9. Reference numeral 301 represents a data register for storing the data which must be corrected, the register 301 being capable of holding 273 bits. Reference numeral 302 represents a syndrome register, consisting of an 82-bit shift register. Reference numerals 303 through 323 represent modulo-two adders, which generate the input signals to be applied to the majority logic circuit or majority decision circuit 341. The input numerals of the adders 307 through 323 (which may be, for example, a TI Model 7468) represent the register numbers of the syndrome register 302. For instance, the input 5, 10 of the adder 307 represent the outputs $S_5$ and $S_{10}$, respectively, of the register stages $S_5$ and $S_{10}$ of the syndrome register 302. The outputs 324 through 340 from the modulo-two adders 307 through 323 are applied to the majority logic circuit 341, and the correction signal 342 from the majority circuit 341 and the output signal from the register 301 are applied to a modulo-two adder 343.

Initially, the syndrome register 302 is set to $S_0=0, \ldots, S_{81}=0$. Until all the bits of the signal 300 have been entered into the data register 301, the majority logic circuit or majority decision circuit 341 remains disabled. When all data have been entered into the data register 301, the first syndrome is determined by the register stages $S_0$ through $S_{81}$, and in response to the threshold value 9 (or 10), the majority logic circuit 341 is enabled. Therefore, the leading bit error is corrected. Whenever syndrome computation is advanced by one bit, the error correction is carried out, and the contents in the data register 301 are shifted by one bit. The adder 343 corrects the output from the register 301, in response to the correction signal 342, whereby the corrected data 344 is derived.

Figure 12:
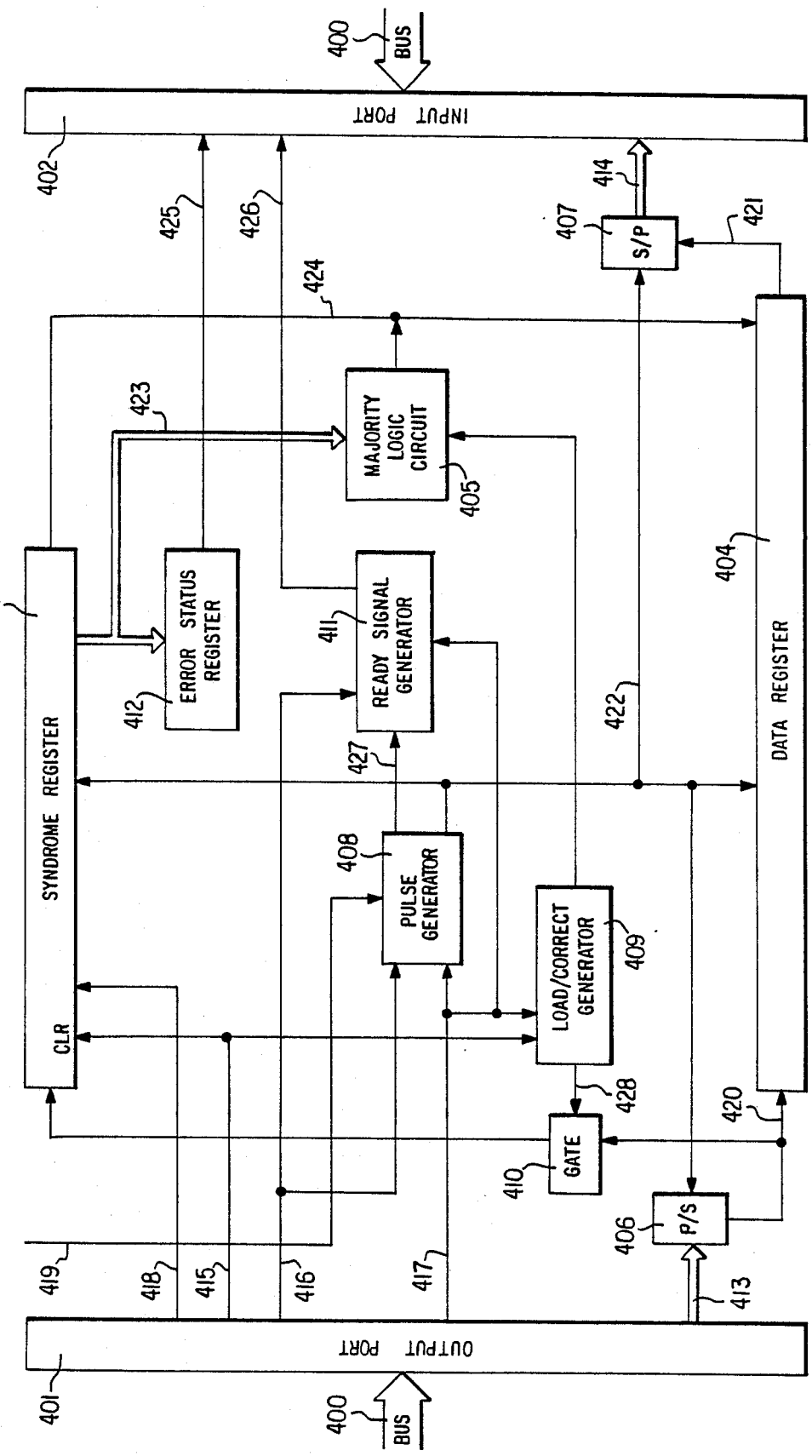
FIG. 12 is a block diagram showing one embodiment of a circuit which is applied to a practical character code broadcasting receiver in accordance with the present invention.

The above-described decoding circuit shows the outline of the decoding procedure. FIG. 12 shows a circuit which can be used in practice for receiving character code broadcasting. Reference numeral 400 represents a CPU bus line; 401, a 16-bit output port from a CPU (not shown); 403, an 82-bit syndrome register with feedback capability; 404, a data register; 405, a majority logic circuit including 17 majority logic input circuits; 406, a 16-bit parallel-serial converter; 407, a 16-bit serial-parallel converter; 408, a 16-bit pulse generator; 409, a load-correct gate generator which generates a signal for data-loading and data-correcting; 410, a gate; 411, a ready signal generator; 412, an error status register; 413, a 16-bit parallel input data; 414, a 16-bit parallel output data; 415, a start signal; 416, a load signal; 417, a correct instruction signal; 418, load-end signal; 419, a clock signal; 420, an input serial data, 421, an output serial signal; 422, a 16-bit clock signal, 423, an 82-bit syndrome data; 424, an error correcting signal; 425, an error status signal; 426, a ready signal; and 427, a 16 bit carry signal. In response to the start signal 415 transmitted from the CPU, the syndrome register 403 is cleared, and the load-correct gate generator 409 is so controlled that the load gate signal 428 may be generated. In response to this signal, the input signal 420 to the syndrome register 403 is sequentially loaded into the syndrome register 403. Thereafter, the CPU transmits a 16 bit data to the data register within the output port 401, so that the load signal 416 is generated. In response to the load signal 416, the 16-bit pulse generator 408 generates 16-bit clock signals for shift operation, so that the data in the parallel-serial converter 406 are read out, and are loaded into the syndrome register 403 and the data register 404. The 16-bit clock signal is generated, in response to the clock signal 419. If it is a signal with a frequency higher than 5 MHz, the errors in one packet can be corrected within a time of less than 1 m second. In response to the load signal, the ready signal generator 411 is reset, and is driven into the busy state. Upon completion of the transmission of the 16-bit shift clock, the 16-bit carry signal 427 is generated, so that the ready signal generator 411 is driven into the ready state. In response to the ready signal 426, the next instruction is requested by the CPU. The above operation is repeated for 272 bits of one packet. Therefore, the data set is repeated $272/16=17$ times, while the load instruction is derived also 17 times.

When all the data have been set into the parallel-serial converter 406 and the load instruction has been generated, the CPU generates the load end signal 418, so that the syndrome register 403 is shifted by one bit. This one bit corresponds to the one bit, which has been shortened. Thereafter, the error correction is carried out from the leading bit. The error correction is carried out for each 16 bits, and the error-corrected 16-bit data is read out by the CPU. The correct signal 417 is an error correcting signal derived from the CPU, and in response to one error correcting instruction, the error of the 16-bit data at the leading end of the data register 404 is corrected. As in the case of the load instruction generated by the load signal 416, in response to the correct signal 417, the 16-bit clock signal is derived from the 16-bit pulse generator 408, so that the registers 403 and 404 are shifted by 16 bits. When the leading end of the data register 404 is detected as being an error, in response to the error correcting signal 424, the error bit is inverted, then its bit is sequentially loaded into the serial-parallel converter 407.

The error correcting signal 424 is derived from the majority logic circuit 405, and is controlled by the output signal from the load-correct gate generator 409, which is controlled in response to the correct signal 417. As in the case of the data loading, when the 16-bit errors have been corrected, the ready signal 426 informs the CPU that 16 bits have been corrected, and that the data is loaded into the register 407, which is a serial-parallel converter. The above-described operation is repeated 17 times, so that 272-bit data including parity can be restored.

Reference numeral 412 represents an error status register, comprising an OR gate to which are applied 82 bits from the syndrome register 403. Whether the contents in the syndrome register 403 are all "0" or not is checked. Under these conditions, when the error signal 425 is applied to the CPU, whether or not the proper correction has been made can be determined. That is, only when the contents in the syndrome register are all "0" has the proper correction been carried out.

So far each 16-bit data has been described as being loaded and after the errors in each 16-bit data have been corrected, the data is read by the CPU, but it is to be understood that in principle, each 8-bit, 34-bit, 68-bit or 136-bit data can be processed in a manner substantially similar to that described above. From the standpoint of the scale of conventional hardware, it is suitable to handle 16-bit data. If one instruction consists of many bits, the circuit components 401, 402, 406 and 407 will become large and complicated.

With regard to the majority logic decodable code, if the number of the majority logic elements is increased, the number of logic circuits which are used in practice will be increased exponentially. Therefore, the code in which the number of the majority logic elements 17 is not used in practice. In order to provide such logic circuits, the number of logic OR inputs becomes $$\sum_{i=9}^{17} 17C_i$$

That is, the number of OR input elements approaches the order of $10^4$, so that the error correction method cannot be applied to home television receivers. If it is attempted to carry out the error correction method with a ROM with 17 bit inputs, a ROM with $2^{17}$ bits would be needed. That is, special and large-sized ROMs would be needed. As a result, the error correcting method cannot be applied to the home television receivers.

Figure 13:
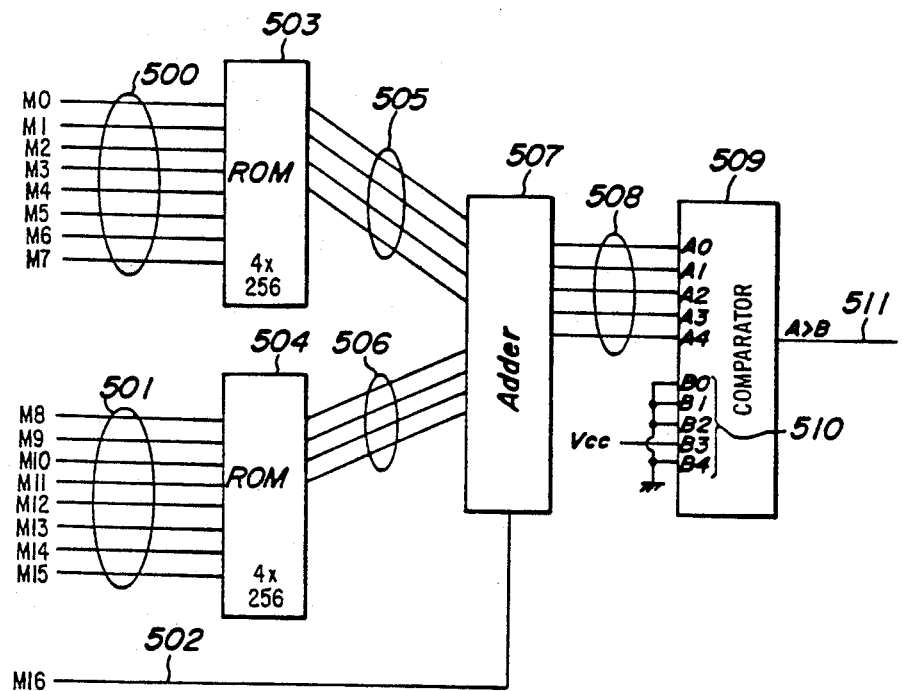
FIG. 13 is a block diagram showing one embodiment of a majority decision logic circuit in accordance with the present invention.

Therefore, according to the present invention, the 17 majority-decision-input (majority logic element) logic can be realized using simplest logic elements as shown in FIG. 13.

In FIG. 13, reference numerals 500 and 501 represent, respectively, 8 majority logic elements. Reference numeral 502 represents the remaining one majority logic element. Reference numerals 503 and 504 represent 4×256 bit ROMs (which may be, for example, Signetics Model 82S129); 505 and 506, the four-bit outputs, respectively, from the ROMs 503 and 504; and 507, a conventional adder (for example, a TI Model 7483) whose output is represented by 508. Reference numeral 509 represents a comparator (for example, a TI Model 7485); 510, an input applied to side B of the comparator 509; and 511, an A>B output from the comparator 509.

In response to the 8-bit input 500, the output 505, which represents the number of "1" in the 8 bits by four bits, is derived from the ROM 503. For instance, if M0=1 and M1=M2=M3=M4=M5=M6=M7=0, the output 505 represents 1 by "1000". In like manner, another 8-bit input 501 is processed by the ROM 504, so that the output 506 which represents the number of "1" is derived. The adder 507 adds the binary outputs 505, 506 and the 17-th majority logic element M16 which is a carry, so that the output 508 is derived. The input to side B is limited to 8, and only when the input to side A 508 is greater than the input 510, the A>B output 511 is derived as "1". Therefore, when more than 9 inputs in the 17 inputs are "1"s, the majority logic or decision can be detected.

Until now, the underlying principle of the (272,190) majority logic decodable code, adapted for use in the error correcting method for character code broadcasting in accordance with the present invention, and the practical reception logic circuit construction have been described. In the case of the practical signal transmission, only the 82-bit parity signal or the 190-bit information signal must be inverted for transmission, and must be restored when received. The reason is that, when the signals in one packet are all "0", they will not represent any code.

Thus far, the method is such that a packet signal is entered into a RAM in a CPU, and the data in the RAM is delivered to the error control I/O, so that the error-corrected data is read again, but it is to be understood that, prior to entering the data into the RAM of the CPU, the errors are corrected. In this case, the error correction time is substantially equal to the time required for loading the data into the shift register. As a result, more than two error correcting circuits of the type described above will be needed.

The error correcting method described above is suitable for the bit error characteristics of a TV transmission path. According to this method, very efficient error correcting ability can be obtained. Furthermore, 272 bits can be corrected as a whole by a simple decoding circuit, which is simpler than any other error correcting methods. As a consequence, the error correcting method in accordance with the present invention is best adapted for the application to an error correcting circuit of a home-use television receiver, which requires inexpensive hardware. In addition, the method of the present invention can simultaneously correct and detect errors, so that it is best adapted for use in a character code broadcasting system in which it is not permitted at all to display error codes.

The method in accordance with the present invention can be adapted to a system similar to a pattern-method teletext broadcasting system, recommended by the Radio Technical Council in Japan, since the method of the present invention uses a 272-bit digital signal to be transmitted per one scanning line of the television signal. Therefore, provided that the bit rate is the same, the method of the present invention can also be applied to a digital facsimile system, a software broadcasting system, a braille broadcasting system for the blind and other code broadcasting systems in addition to the present teletext broadcasting system.

As described above, the (272,190) majority logic decodable code can correct any errors of less than 9 bits, which occur at any position in one packet. In case of correction of an error of more than 9 bits, however, there exists only a few error correcting patterns, and in practice, it is impossible to correct almost all errors of more than 8 bits.

Therefore, another embodiment of the present invention, capable of correcting errors on the order of 9, 10, 11 and 12 bits with a relatively high degree of accuracy, will be described.

In the following embodiment, almost all error patterns of 9 bits can be completely corrected, so that the page error rate can considerably be improved.

First, the underlying principle will be described. As described above, the generator polynomial G(x) of the (273,191) code is given by $$G(x) = X^{82} + X^{77} + X^{76} + X^{71} + X^{67} + X^{66} + X^{56} + X^{52} + X^{48} + X^{40} + X^{36} + X^{34} + X^{24} + X^{22} + X^{18} + X^{10} + X^4 + 1.$$

The matrix expression of the generator polynomial is expressed as follows:

$$G = \begin{pmatrix} \overbrace{\begin{bmatrix} I & P \\ & 1 & 1 \end{bmatrix}}^{191 \quad 82} \end{pmatrix} \updownarrow 191$$

where, I expresses a unit matrix of $191 \times 191$ and p expresses a matrix of $82 \times 191$. The check matrix H is expressed by $$H = \begin{pmatrix} \overbrace{\begin{bmatrix} P^T & I \end{bmatrix}}^{191 \quad 82} \end{pmatrix} \updownarrow 82$$

An orthogonal parity check sums in which each leading bit is orthogonal, may be produced by the linear combination of 82 column vectors of the matrix H. The leading portions of the 17 orthogonal parity check sums may be expressed as follows:

$$H_1 = \begin{pmatrix} \text{(columns 1-19 ... 273)} \\ \text{matrix entries} \end{pmatrix}$$

Where, $H_1$ is the orthogonal parity check sums obtained by the linear transformation of the check matrix H.

The reception vector r is $$r = c + e$$

where, c is a code signal, and e is an error signal. Therefore, the orthogonal parity check sums are expressed by $$r \cdot H_1^T = (c+e) \cdot H_1^T = eH_1^T$$

Therefore, it is necessary to consider only errors, so that only $eH_1$ will be investigated. Assume that there exist more than 8 bits. In the case of an error of less than 9 bits, all the errors can be corrected, in view of the underlying principle of the code.

(1) When the first nine bits are all erroneous, the error vector e is expressed by $$e = (1,1,1,1,1,1,1,1,1,0,0,0, \ldots, 0)$$

Hence, $$eH_1 = (1,0,1,0,1,1\ 1,0,0,1,0,1,1,0,1,0,1,0,1)$$

The number of 1s is 11, which exceeds the threshold value 9, so that the first bit is corrected. The remaining 8 bits can naturally be corrected, so that the nine bits can be corrected after all.

Therefore, in the case of an error of nine bits, if the leading error is detected prior to the correcting operation and then corrected, the remaining eight erroneous bits can be corrected. Thus, all the 9 erroneous bits can be corrected. Therefore, if an error correction is impossible by a first error correcting operation, then the data is cyclically shifted by one or more bits, so that the error correcting operation is made again. While cyclically shifting, the leading error bit can be detected, so that all the nine bit errors can be corrected.

(2) Let us consider the following 10 bit error:

$$e = (1,1,1,1,1,1,1,1,1,1,0,0,0,0, \ldots, 0)$$

(3) Provided that the first 11 bits are all erroneous, $$e = (1,1,1,1,1,1,1,1,1,1,1,0,0,0, \ldots 0)$$

$$eH_1^T = (1,0,1,0,1,1,0,0,1,0,1,1,0,1,0,0,1)$$

The number of 1s is 9, so that the leading bit is corrected. The remaining ten erroneous bits can be corrected as described in Item (2). Therefore, the above described error pattern can be completely corrected.

$$eH_1^T = (1,0,1,0,1,1,0,0,1,0,1,1,0,1,1,0,1)$$

Since the number of 1s is ten, the leading bit is corrected. The remaining nine erroneous bits can be corrected as described in (1), so that ten erroneous bits can be corrected.

(4) When the first 12 bits are all erroneous, $$e = (1,1,1,1,1,1,1,1,1,1,1,1,0, \ldots, 0)$$

$$eH_1^T = (1,0,1,0,1,1,0,0,0,0,1,1,0,1,0,0,1)$$

The number of 1s is 8, so that even though the leading bit is erroneous, the error correction cannot be made. That is, the proper correction is impossible.

(5) Next, let us consider the case in which 11 consecutive bits are all erroneous, and the error starts from the second bit. Then, $$e = (0,1,1,1,1,1,1,1,1,1,1,1,0,0, \ldots, 0)$$

$$eH_1^T = (0,1,0,1,0,0,1,1,1,1,0,0,1,0,1,1,0)$$

Since there exist nine 1s, the leading bit is corrected, even though the leading bit is correct. Therefore, even if the correction is made up to the last bit, no proper correction is made. The fact that the proper correction is not made is detected by a content in the syndrome register, all of which are not "0".

In this case, the data is cyclically shifted by one bit, so that the error data has the same form as that of the error data as described in Item (3). As a result, the error correction can be made.

While, it has been described that the orthogonal parity check sums $H_1$ is so constructed that the first bit of 273 bits may be orthogonal, it is to be understood that by applying the principle of the difference set, a matrix in which the second bit is orthogonal can be constructed. In this case, the load end instruction (one bit shift of the shortened bit) described in conjunction with the practical circuit is not required. Therefore, the error correction can be made from the second bit, so that there is the advantage that the circuit can be simplified in construction.

As described above, if the leading bit of a group of erroneous bits is corrected as soon as possible, the remaining erroneous bits can be corrected with a high degree of probability.

Therefore, as described in Item (1), the possibility of correcting an error of more than 8 bits can be increased by shifting the received data by one bit, while utilizing the cyclic characteristic of the cyclic code, when it is judged that a complete correction is impossible after the first error correcting operation.

Figure 14:
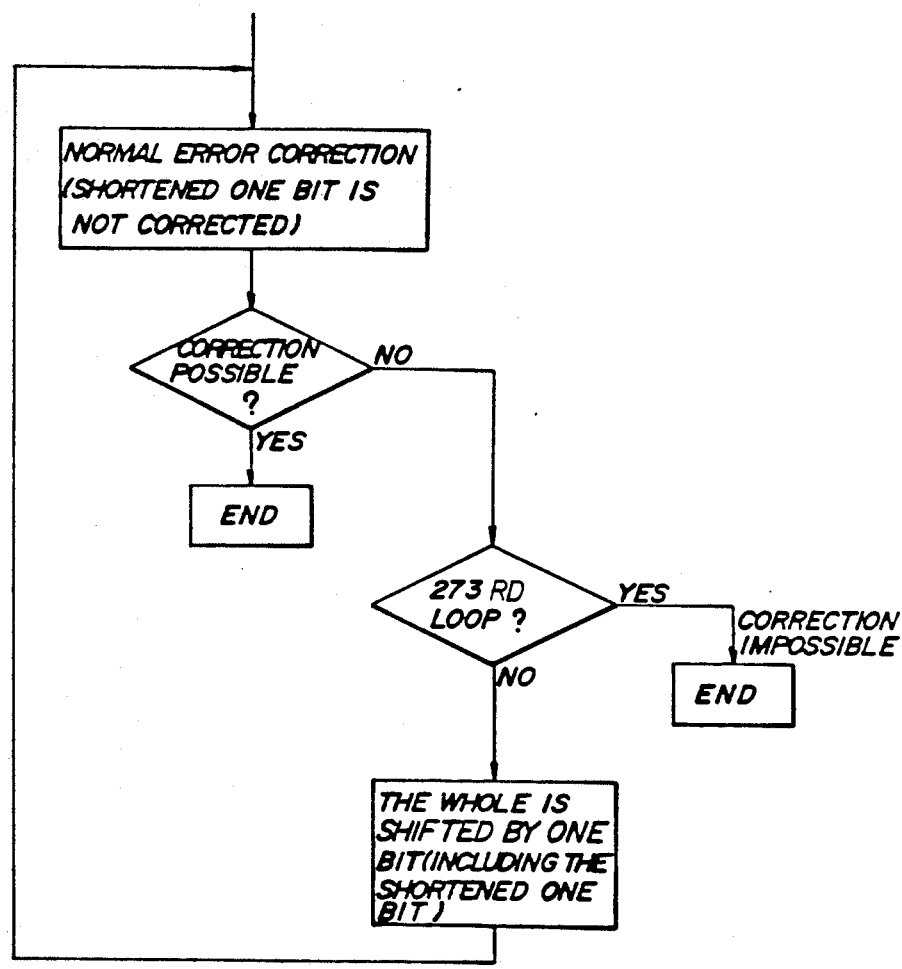
FIG. 14 is a flowchart showing the error correction procedure in accordance with the present invention.

FIG. 14 shows an example of a flowchart of the error correcting operation.

Figure 15:
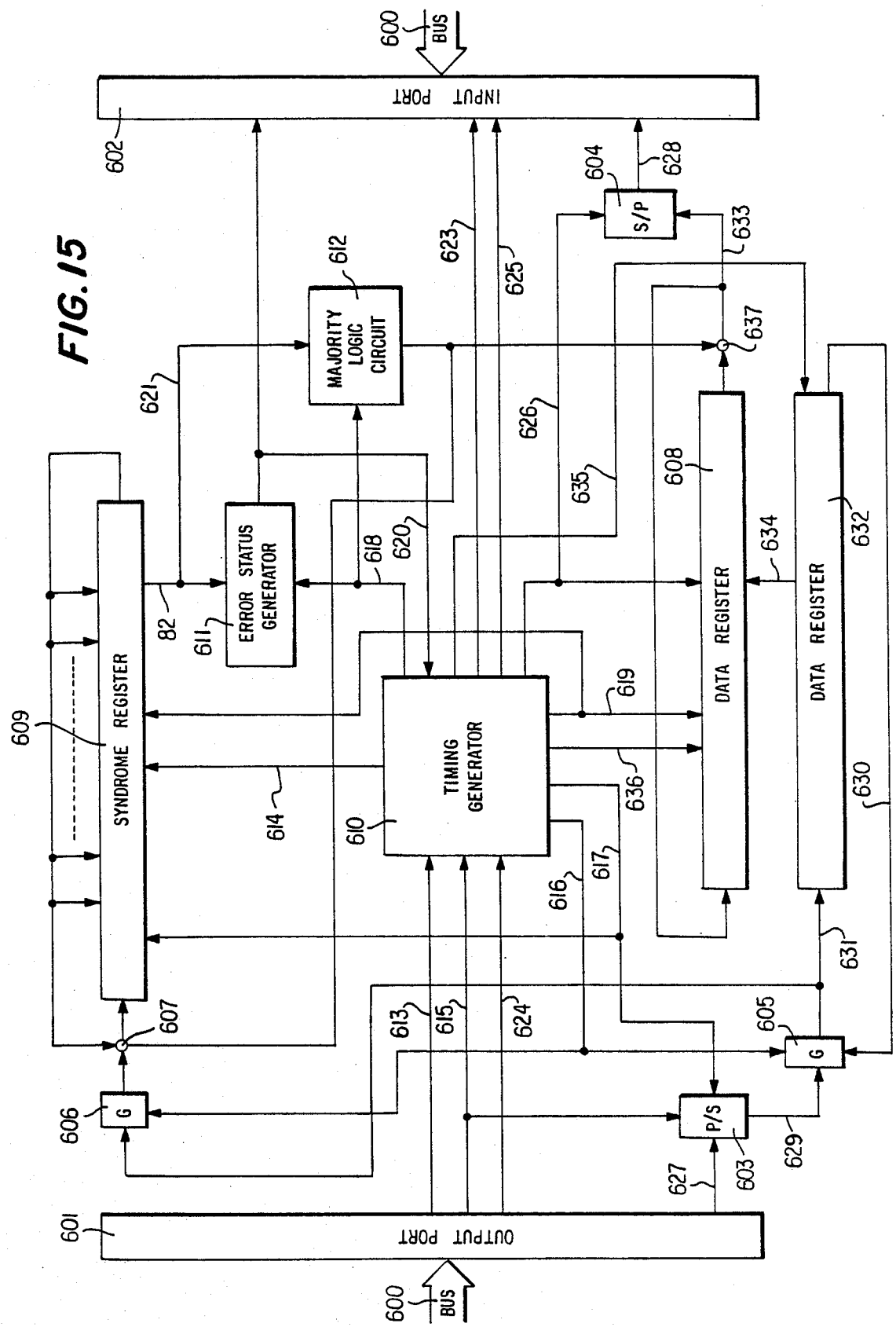
FIG. 15 is a block diagram showing one embodiment of a circuit used for carrying out the present invention.

FIG. 15 shows practical hardware for carrying out the second embodiment of the present invention. Reference numeral 600 represents a CPU bus line (the CPU is not shown); 601, a CPU output port (for example, a Motorola Model 6820); 602, a CPU input port (for example, a Motorola Model 6820); 603, a parallel-serial converter (for example, a MMI Model 16R6); 604, a serial-parallel converter (for example, a MMI Model 16R6); 605 and 606, gates; 607 and 637, modulo-two adders; 608, a data register (for example, a TRW Model TDC1006J, a MMI Model 20×8); 609, a syndrome register (for example, a MMI Programmable Logic Array Model 20×10); 610, a timing generator; 611, an error status register (for example, a MMI Model20C1); 612, a majority logic circuit; 613, a start instruction signal; 614, a clear signal; 615, a load instruction signal; 616, a load gate signal; 617; a load clock signal; 618, a correction gate signal; 619, correction clock signal; 620, an error status signal; 621, an 82-bit syndrome signal; 622, an error correcting signal; 623, a proper completion signal; 624; a fetch instruction signal; 625, a fetch ready signal; 626, a fetch clock signal; 627, a load data; 628, a fetch data; 629, a load serial data; 630, a cycled load data; 631, a load data for obtaining the syndrome or rearranging the data; 632, a data register for holding an original data value which has been shifted; 633, a data whose errors have been corrected; 634, a rearranged data shifted by one bit; 635, a data shift clock signal; and 636, a parallel load signal.

Next, the operation of this circuit will be described. The mode of operation is divided into (1) a load mode in which an initial data is loaded from the CPU, (2) a correction mode in which correct is made and (3) a fetch mode in which the data is read out by the CPU after error correction.

(1) Load Mode

In response to 1 packet signal of 272 bits, the CPU outputs the start instruction 631, and in response to the reset signal 614,82 states of the syndrome register 609 are all set to "0". Thereafter, the CPU sets the data to be loaded into the output port, so that the load instruction signal 615 is produced. The parallel data is loaded into the register 603. In response to the load control signal 616, the gates 605 and 606 are controlled, so that the input signal 629 is sequentially loaded into the syndrome register 609 and the data register 632. One packet signal consists of 272 bits, then the content of the shortened first bit is set to "0". Parallel data is applied to the parallel-serial converter 630 in the form of a unit signal of 8 or 16 bits. Therefore, the load operation is repeated 35 or 18 times. When the loading of the data into the syndrome register 609 and the load data register 632 is completed, all of the data in the register 632 is copied into the data register 608 at the timing of the parallel load signal 636. In this stage, no error correction signal 622 is generated in response to the correction gate signal 618, as a matter of course.

(2) Correct Mode

Upon completion of the data loading operation from the CPU, the correction mode is started. The correction clock signal 619 is outputted consecutively for 273 bits. Here, the first bit is shortened, so that the duration of the correction gate signal 618 has a period of time corresponding to 272 bits. When the error correcting signal is outputted from the majority logic circuit 612, the data in the data register 609 and the syndrome in the syndrome register 609 are corrected in response to the error correcting signal 622. Thus, the error correction is completed in the bit sequence of the received packet signal.

Unless 82 bits in the syndrome register 609 are all detected as "0" by the error status register 611, the circuit advances to the next stage. This is initiated by the error status register signal 620. First, the original data series 632 is cyclically shifted by one bit. The number of the bits of the shift clock signal 635 is the sum of one bit shift and the number of shifts for obtaining the syndrome; that is, the total number of bits is 274. This output signal is sequentially loaded, through the gates 605 and 606, into the syndrome register 609, so that the syndrome is produced. In this case, the clock signal 619 consists of 273 bits, because one bit is removed in order to change the bit position. Then the data in the data register 632 is shifted for 274 bits, so that the syndrome is produced. Then, in response to the parallel load signal 636, the 273 bits in the load data register 632 are loaded into the data register 608. Thereafter, the above-described error correcting operation is carried out. However, it should be noted that the last bit, which is shortened, is not corrected.

(3) Fetch Mode

Unless the error status signal 620 shows "No Error", the above described sequence of operations is automatically repeated. The error collecting operation is repeated 273 times by shifting the leading bit, which is to be corrected first, by one bit. After this operation, the proper completion signal 623 is delivered to the CPU, since the state same as the original state is obtained. The error status signal 620 is read in by the CPU. If all the errors are not corrected completely, an error state is detected, since the correction fails.

When the correction is proper, the CPU generates the fetch instruction signal 624, and the signal stored in the data register 608 is used. Further, the leading bit is not necessary, so that it is sufficient that the last 272 bits of the 273 bits are fetched. The data is sequentially loaded from the data register 607 into the serial-parallel converter 604. In response to the fetch ready signal 625, the CPU receives the signal from the serial-parallel converter 604, so that the next fetch instruction 624 is generated. The above-described operation is repeated, so that one packet signal is restored in the CPU.

While in the above-described example, the operation is carried out in the last stage where the last bit comes to the leading end, a correctable error in almost all cases indicates that the contents of the syndrome register 609 are all "0" during the cyclic shifting operation by the error status signal 620.

After the completion of all error correction is instructed by the error status signal 620, the correction clock signal 619 proceeds to the next operation. That is, the data in the register 608 must be rearranged into the original bit arrangement. Let n denote the number of shifts, when the bits in the error status signal 620 are set, and let N denote the number of rearrangements of cyclically shifting the leading bit by one bit (that is, the mode in which the N-th bit from the leading bit is loaded into the syndrome register 609 as the leading bit). Then, the leading bit is arranged at the leading bit position, after the shifts of $(273-n+273-N)$ times within the data register 608. At this time point, the correction completion signal 623 is set and is provided to the CPU. In response to the above-described fetch instruction, the CPU reads the data, so that the correct data of the original bit arrangement can be obtained.

While the above-described embodiment employs the hardware for carrying out the various operations, it is to be understood that the operations may be carried out by shift control software and the circuit shown in FIG. 12, if the data register 404 has 273 bits. That is, the shift of the data is carried out in the CPU, and the data is loaded into the circuit as shown in FIG. 12. However, in this case, there is the disadvantage that the processing time becomes slightly longer. As to the shortened 1 bit, so far it has become described that the error correction operation is stopped, but it is to be understood that in order to simplify the circuit, the shortened bit can be treated like other bits, so that all the bits can be subjected to the error correction operation. In this case, the error influence rate due to the shortened bit is 1/273.

While in the above embodiment, the data is cyclically shifted by one bit when one error correction is impossible, it is to be understood that, in order to simplify the circuit or to speed up the processing time, the data can be shifted by a plurality of bits. For instance, if the data is shifted by two bits, there is the advantage that the processing time is reduced to one half.

Let us assume that the above-described (272,190) majority logic decodable code is used. In this case, when there exists a burst error of more than 9 bits in one packet, or when more than two uncorrectable bits occur in the framing signal portion for frame synchronization, there is the disadvantage that one packet signal is missed. The framing signal consists of 8 bits, so that one bit error of the 8 bits can be corrected.

FIG. 16 shows a teletext broadcasting packet signal. Reference numeral 700 represents a horizontal synchronizing signal; 701, a color burst signal; 702, a clock-run-in signal for clock synchronization, 703, a framing signal for frame synchronization; and 704, a 34-byte packet signal.

FIG. 17 shows a packet signal transmitted in accordance with the present invention. One packet signal transmitted in a standard arrangement, is dissolved by 8 bit unit as indicated by X in FIG. 17, and the 8 bit units are dispersed into each packet. Therefore, one packet signal indicated by X is dispersedly transmitted by 34 packets. On the reception side, there is provided a buffer, which is substantially similar in scale to that as shown in FIG. 17. In the case of decoding, 8 bit units indicated by X are sequentially loaded in the buffer and converted into a standard arrangement signal. Then, the error correction is carried out for each packet. In this manner, by using the interleaved arrangement among the respective packets (field) by 8 bits, errors caused by noise which is mixed into the packet in the form of burst, can be corrected. That is, even if all the bits of one packet signal are erroneous (such phenomenon hardly occurs in practice, and even if errors are mixed into the whole packet, the average is $272/2=136$ bits.), the errors can be divided into each 8 bits, and uniformly distributed into 34 packets. As a result, any kind of 8 bit errors which occur at random in one packet (272 bits) can be corrected by the (272,190) error correcting code.

This means that, even if the whole data of one packet is lost due to a framing error, if the arrival of the signal is detected, an error can be sufficiently corrected by assuming that the received signal does not have a predetermined value "0" or "1", once the signal arrival is detected, since the received signal is correct with a probability of ½. When the received signal is assumed to have a predetermined value as described above, the number of average error bits is $272/2=136$ bits. Accordingly, an error can be corrected, even if there are two framing errors on average.

When the packet signal is transmitted in such a bit arrangement as described above, the urban noise such as noise from automobiles which occurs in the form of burst, and impulsive noise from home electrical appliances, can be sufficiently eliminated. With regard to the noise which is generated at random, the effect is substantially similar to that in the case of the standard arrangement.

Next, the logic on the receiver side will be described. The RAM in the receiver is provided with a $34 \times 34 = 1156$ byte buffer, as shown in FIG. 17. Let A0 denote the leading address. Then, the packet signal which has been received first is stored in the addresses A0 through A0+33. Next, a received packet is stored in the addresses A0+34 through A0+67. That is, the most recent packet with the n address is stored in the addresses A0+34(n−1) through A0+34(n−1)+33. When n becomes 34, the 1156 byte buffer is fully loaded, and the error correcting operation of the packet signal is started. The data which is loaded into the error correcting circuit is indicated by X in FIG. 17, and the addresses are A0, A0+35, A0+70, A0+105, ..., A0+1155. The packet signal with n=35 is stored again in the addrresses A0 through A0+33. Therefore, the general equation for expressing the addresses for storing the n-th packet signal is expressed by $$A0+34(\{n/34\}-1) \text{ through } A0+34\{n/34\}-1$$

where, { } is a residue. The packet which is to be decoded, when n=35, is represented by O in FIG. 17. That is, A0+34, A0+69, A0+104, ..., A0+33. The general equation is given by A0+34×({n/34}−1) through
A0+33.35−({n/34}−1)

A0+33−({n/34}−1) through
A0+33+34×({n/34}−1).

In like manner, when n=36, Δ is obtained sequentially, and when n=37, ● is obtained sequentially. And they are loaded into the decoding circuit, so that the errors in one packet are corrected.

Figure 18:
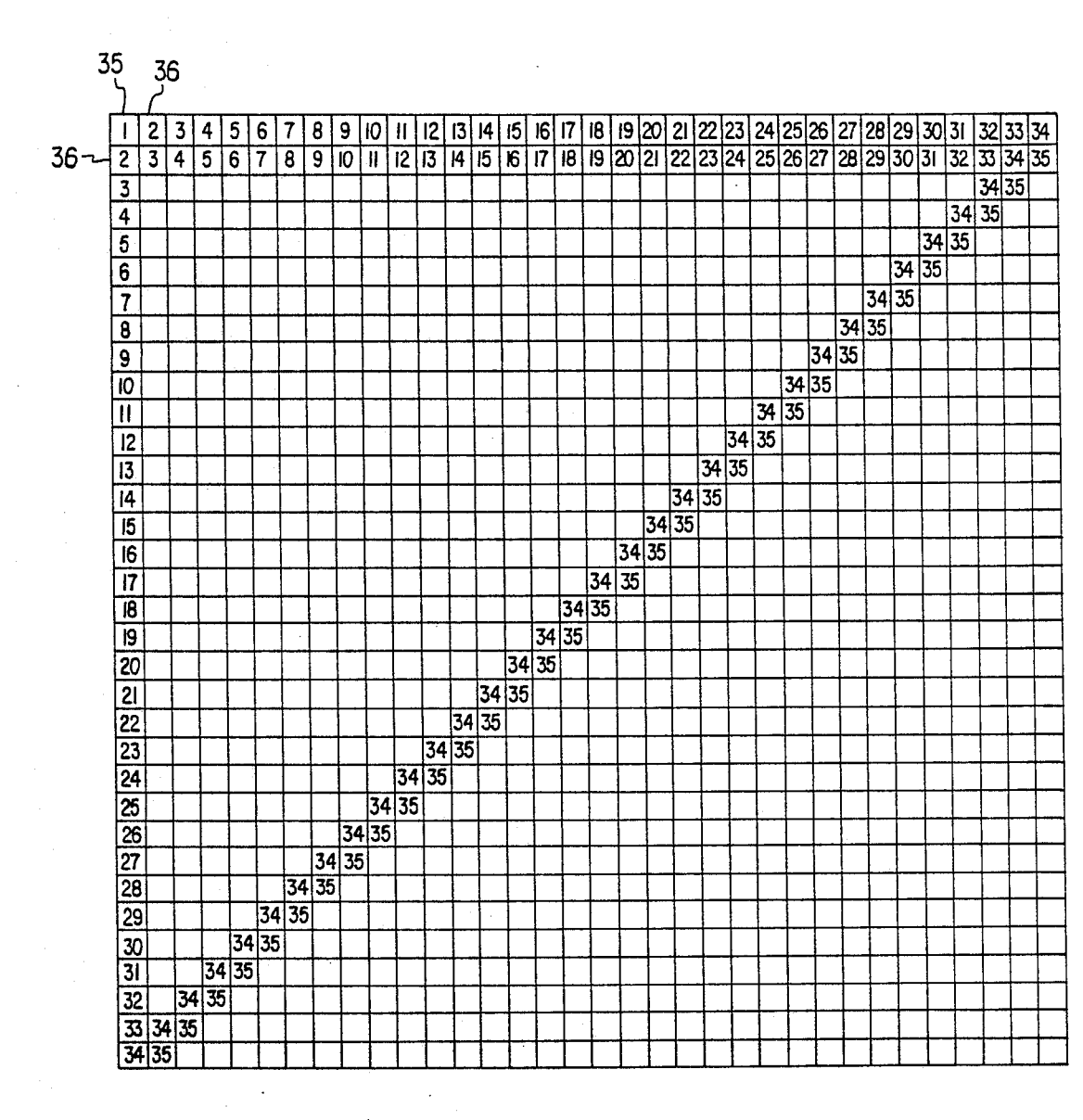

In the embodiment shown in FIG. 17, the received packet signals are sequentially written into the RAM in the CPU, and when they are passed through the error correcting decoder, one packet is decoded. In contrast, in FIG. 18, when data is loaded into a packet buffer, it is sequentially stored in a prredetermined address. When the data is read out, 34 bytes are read out from the consecutive addresses, so that the data for one packet can be directly obtained. In FIG. 18, the numerals show the transmitted packet numbers. The general equations for writting are expressed as follows:

A0+34(n−1), A0+34(n−1)−33, ...
A0+34(n−1)−33(n−1)

and

A0+34×X+{n/34}

A0+34×33+{n/34}−33 ...

A0+34×33+{n/34}−33 (33−{n/34})

where
A0 indicates the leading address,
n indicates the n-th packet and
{∠} indicates a residue.

When the 8-bit data is written in accordance with the above-described equations, the data for one packet can be obtained by sequentially reading out 34 byte data. In this case, the leading address is given by A0+34(n−1).

The methods described above, with reference to FIGS. 17 and 18, are such that one byte data is sequentially transmitted by delaying one packet. And, the data for one packet is restored after the reception of 34 packets. Further, in principle, it is possible to arrange each byte (8 bits) at random, so that this scramble transmission may be used for a pay TV system as secret transmission.

Figure 19:
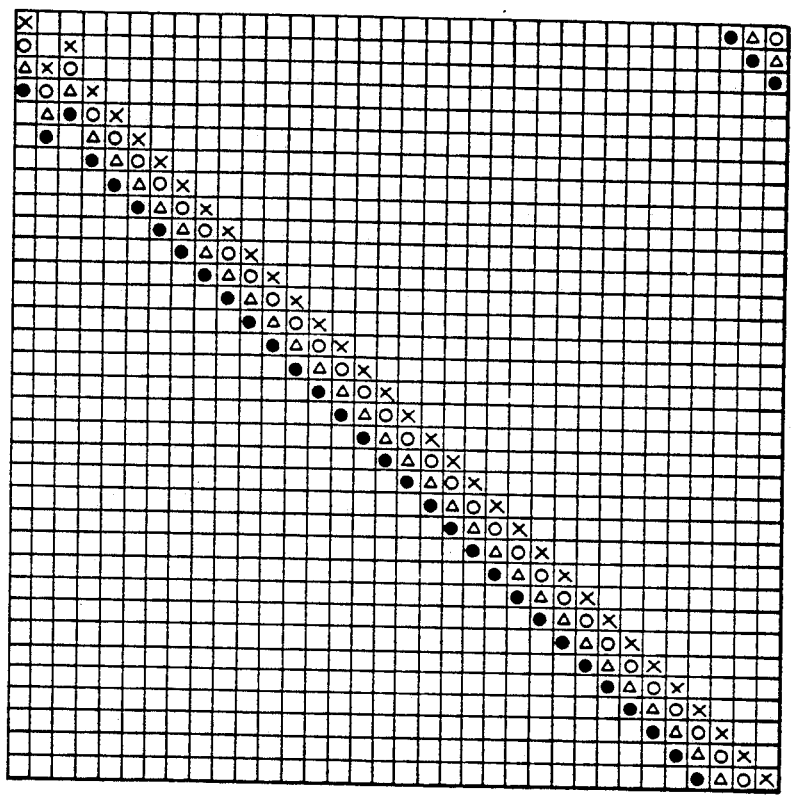
FIG. 19 shows a further example of a packet signal in accordance with the present invention.

In FIG. 19, only the second and third bytes shown in FIG. 17 are replaced from each other in order to explain the underlying principle of the scramble transmission of each byte among plural packets. The receiver is provided with a packet buffer as shown in FIG. 19, and when the 34-the packet is received, the bytes indicated by X are read out. Thus, the data for one packet is reconstructed, and then decoded. In like manner, upon reception of the 35-th packet, the bytes indicated by O are read out; upon reception of the 36-th packet, the bytes indicated by Δ are read out; and upon reception of the 37-th packet, the bytes indicated by ● are read out. Thus, the packet signals are sequentially restored. Of course, the 35-th packet is stored from the addresses A0; the 36-th packet is received in the addresses starting from A0+34; and the 37-th packet is stored from the addresses A0+68. A0 shows the leading address of the packet buffer. If it is assumed that the leading byte of each packet is sequentially transmitted on the order of transmission, the number of available patterns is given by

33!≃8.68×10³⁵.

The whole number of packets, which can be transmitted in one day by utilizing 1H in the vertical blanking period of TV signal is given by

60×60×60×24=5.18×10⁶.

Therefore, even if someone knows the underlying principle of the scramble in accordance with the present invention, but does not know the scramble transmission pattern, 10²⁹ days would be required for decipherment, even when the transmitted pattern is searched bg producing random patterns on the receiver side. Thus, the decoding is impossible.

Furthermore, if information for reversing each of 33 bytes is added to the data, 2³³ patterns are available, so that the astronomical figure of 2³³×10²⁹ days would be required.

FIG. 20 shows ROM information for decoding the above-described scramble. The ROM has 34×(5+1) bits=204 bits.

In FIG. 20, the address shows a packet number, corresponding to a byte number which is required for restoring the first packet. It is sufficient to indicate from 0 to 33, so that five bits are sufficient. The inversion information shows, whether each byte in one packet is inverted and transmitted or not. For this purpose, only 1 bit is required.

If the station gives new ROMs as shown in FIG. 20, whenever a broadcasting station changes its scramble addresses and inversion information, no one can listen or view a program of that station without permission or the ROM.

Even if either of the above-described scrambling systems may be used, the system satisfactorily functions. It is apparent that the inversion information and the scramble addresses may be designated per a plurality of bits such as 16, 34 and 68.

As described above, in the embodiment where each byte forming one packet for teletext broadcasting is transmitted by different packets, the error correcting ability is enhanced, even when bit errors are produced in the form of a burst. According to the eight bit error correcting method using the (272,190) code in accordance with the present invention, all information can be restored, even if one packet information is lost. That is, even when a framing error occurs, all errors can be corrected, if other 33 packets have no error.

In the case of the embodiment shown in FIG. 17, the receiver has a 34×34 byte packet buffer, and the received packet signal is cyclically written into the packet buffer, so that each byte can be read out obliquely. Thus, the signal for one packet can be reconstructed.

In the embodiment shown in FIG. 18, the received packet signals are obliquely written in accordance with a predetermined rule, so that one packet signal can be obtained by reading out 34 bytes consecutively.

In the case of the embodiment shown in FIG. 19, when the signal is transmitted, the packet of each byte to be transmitted is arranged at random, so that the embodiment can be applied for scramblers, while the error correcting ability can be maintained the same as in the case of the embodiment described-above. Therefore, broadcasting stations may consider the usage of this embodiment as a pay television system.

In the case of the embodiment shown in FIG. 20, in addition to the embodiment shown in FIG. 19, the inversion information for each byte is added to the data, so that TV poaching is extremely difficult.

The present invention, described above with reference to FIGS. 1 through 20, has an advantage in that it is sufficient to correct errors by shifting bit position, even if an error correction cannot be made. Accordingly, it is possible to increase the probability of correcting more than 8 bit errors which are essentially impossible to be corrected. In addition, the error detecting ability is not degraded. Therefore, the present invention is very effective in correcting errors in the teletext braodcasting system, so that the teletext broadcasting service area can be considerably expanded.

While in the above described embodiments, the digital signal in which information is coded has been described as being inserted into the vertical blanking period of the television signal, it is to be understood that such digital signal can be inserted in various forms in a transmission path or such digital signal can be used alone.

As described above, the error correcting method using the (272,190) code is best suitable for the teletext broadcasting system like in Japan and other countries. But, when the above-described fundamental error correcting method is used, it is possible to correct 8 bit errors in one packet of 272 bits, but it is almost impossible to correct more than 8 bit errors. According to the above-described improved error correcting method wherein, if errors cannot be corrected, the leading bit is shifted, so that more than 8 bit errors can be corrected, there exists a disadvantage in that the processing time becomes longer.

Therefore, referring to FIGS. 21 through 25, an error correcting method, which not only improves the error correcting ability but also shortens the processing time, will be described below.

Figure 21:
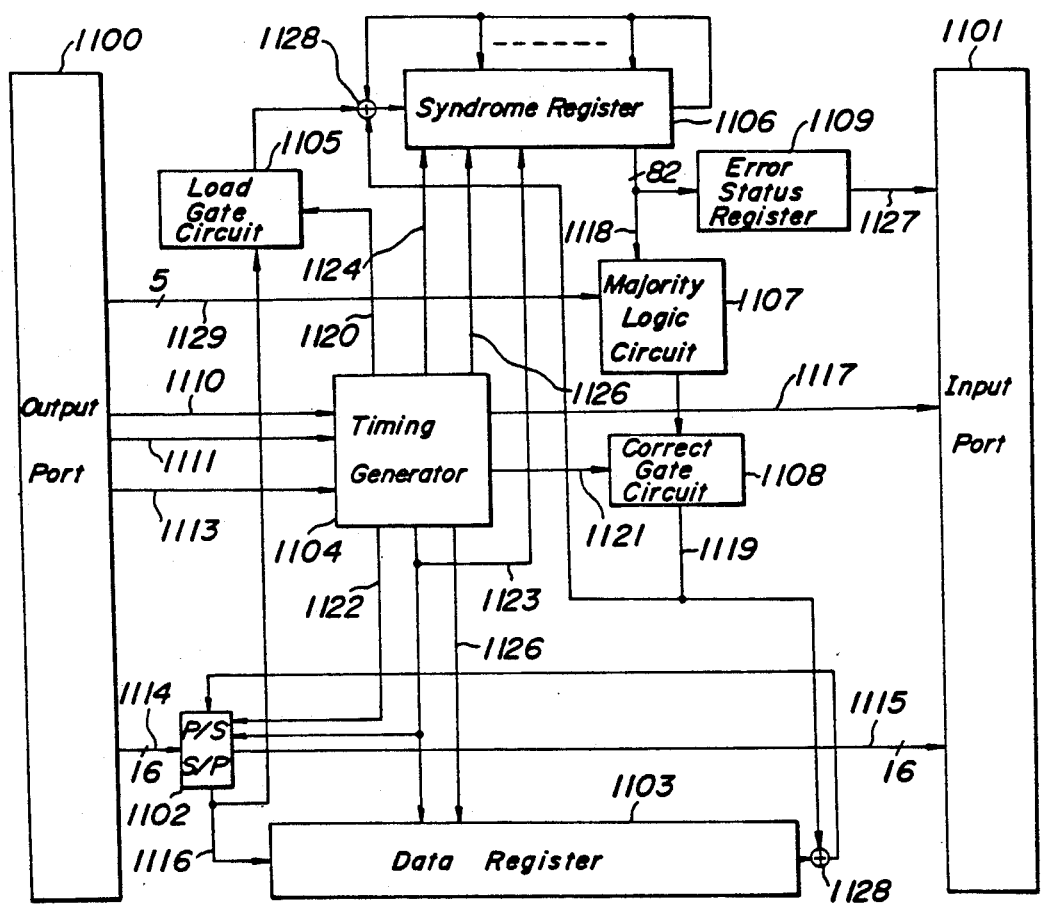
FIG. 21 is a block diagram showing a first embodiment of an error correcting and detecting circuit in accordance with the present invention.

FIG. 21 shows such an embodiment of an error correcting circuit in accordance with the present invention. Reference numeral 1100 denotes an output port; 1101, an input port; 1102, a parallel-serial/serial-parallel converter; 1103, a data register with 272 stages; 1104, a timing generator; 1105, a load gate circuit; 1106, a syndrome register with 82 stages; 1107, a majority logic circuit; 1108, a correction gate circuit; 1109, an error status register; 1110, a start signal; 1111, a load signal; 1113, a correct signal; 1114, data which is to be corrected; 1115, data which has been corrected; 1116, a serial load data; 1117, a ready signal; 1118, a syndrome register signal; 1119, an error correcting signal; 1120, a load gate signal; 1121, a correction gate signal; 1122, a load timing signal; 1123, a load clock signal; 1124, a clear signal; 1126, an error correcting clock signal; 1127, an error status signal; 1128, a modulo-two adder; and 1129, a threshold value designation signal (5 bits).

The fundamental circuit construction of this embodiment is substantially similar to that of the embodiments described above with reference to FIGS. 1 through 20, except that (1) the threshold value can be varied in response to the signal 129; (2) the element of orthogonal parity check sums comprises the leading bit after one bit is shortened. Thus, if the leading bit of the transmission data is made orthogonal, then the load end signal can be eliminated.

Next, the operation will be described. A feature of this embodiment is that the correction is made by decreasing the threshold value in the order of 17, 16, 15, 14, 13, 12, 11, 10 and 9, so that the error correcting ability is improved as will be described in detail below.

First, the CPU (not shown) sets the threshold level to 17 (5-bit information). Thereafter, the CPU generates the start instruction (the start signal 1110), so that all the 82 bits of the syndrome register 1106 are set to "0" (see the reset signal 1124). As a consequence, the next data is ready to be loaded. The CPU divides the information of 272 bits corresponding to one packet into 16-bit groups, and loads 17 times sequentially. The CPU loads the load data on the data 1114 to be corrected, so that the load instruction is generated (see the load signal 1111).

In response to the load signal 1111, the load gate signal 1120 and the load clock signal (16 bits) 1123 are generated. As a result, the load gate circuit 1105 for leading the data to the syndrome register 1106 is controlled; the data 1114 to be corrected is loaded into the parallel-serial converter 1102; the data transferred from the parallel-serial converter 1102 to the data register 1103 is shifted by 16 bits; and the data in the syndrome register 1106 is shifted by 16 bits.

The above-described operation is repeated 17 times, so that the leading data reaches the leading end of the data register 1103. The syndrome register 1106 has already generated the syndrome. That is, the 82 bit syndrome register 1106 represents the residue class, obtained by the division of the data by the generator polynominal g(x).

$$S(x) = \left\{ \frac{a_0 x_{271} + a x_{270} + \ldots + a_{270} x + a_{271}}{g(x)} \right\}$$

where,
 S(x) is the syndrome,
 $a_0 \ldots A_{271}$ are data of 272 bits
 g(x) is the generator polynominal explained before with reference to FIGS. 1 through 20; and
 { } represents the residue class.

Next, the error correcting operation will be described. In response to the correction instruction, the CPU generates the correct signal 1113. Meanwhile, the timing generator 1104 generates the error correcting clock signal 1126, so that only 16 bits of the data stored in the data register 1103 are corrected, and then loaded into the serial-parallel converter 1102. This error correction is accomplished by an exlusive-or circuit (that is, the modulo-two adder) 1108. Seventeen linear combinations are made from the 82-bit content of the syndrome register 1106. The 17 combinations are compared in the majority logic circuit 1107 (the initial threshold value is 17: the threshold value designation signal 1129), and then the error correcting signal is derived from the correct gate circuit 1108.

However, the error correcting signal 1119 is so constructed that it responds to the correction gate signal 1121, so as to be transmitted only in the case of the error correction (see the correction gate circuit 1108). Like As in the case of the error correction, if there exists a bit error, the error correcting signal 1119 modifies the content of the syndrome register 1106, so that the influence of this bit can be eliminated.

After 16 bit errors have been corrected in this manner in response to the correct signal 1113, the CPU confirms whether or not the ready signal 1117 has been generated, and then reads the data 1115 in the input port 1101. The correct signal 1113 is outputted 17 times, so that the signal consisting of one packet of 272 bits is restored. In this case, whether or not proper error correction has been made can be detected by investigating the error status signal 1127. If the contents of the syndrome register 1106 is not all "0", there still exists an error bit, so that the error correction is carried out again. In this case, the threshold value of the majority logic circuit 1107 is decremented by 1. That is, the new threshold value becomes 16, and the data which has been corrected with the threshold value 17 is used.

The above-described operation is repeated, until the threshold values becomes 9. However, when the contents of the syndrome register 1106 become all "0" during the course of the operation, the error correcting operation is deemed to be completed. In other words, at this time point, the data has the correct value, so that it is not necessary to pass the data to the error correction circuit after this time point. While in this embodiment, the data on the input and output ports has 16 bits, it is to be understood that any desired number of bits are acceptable in like manner.

Figure 22:
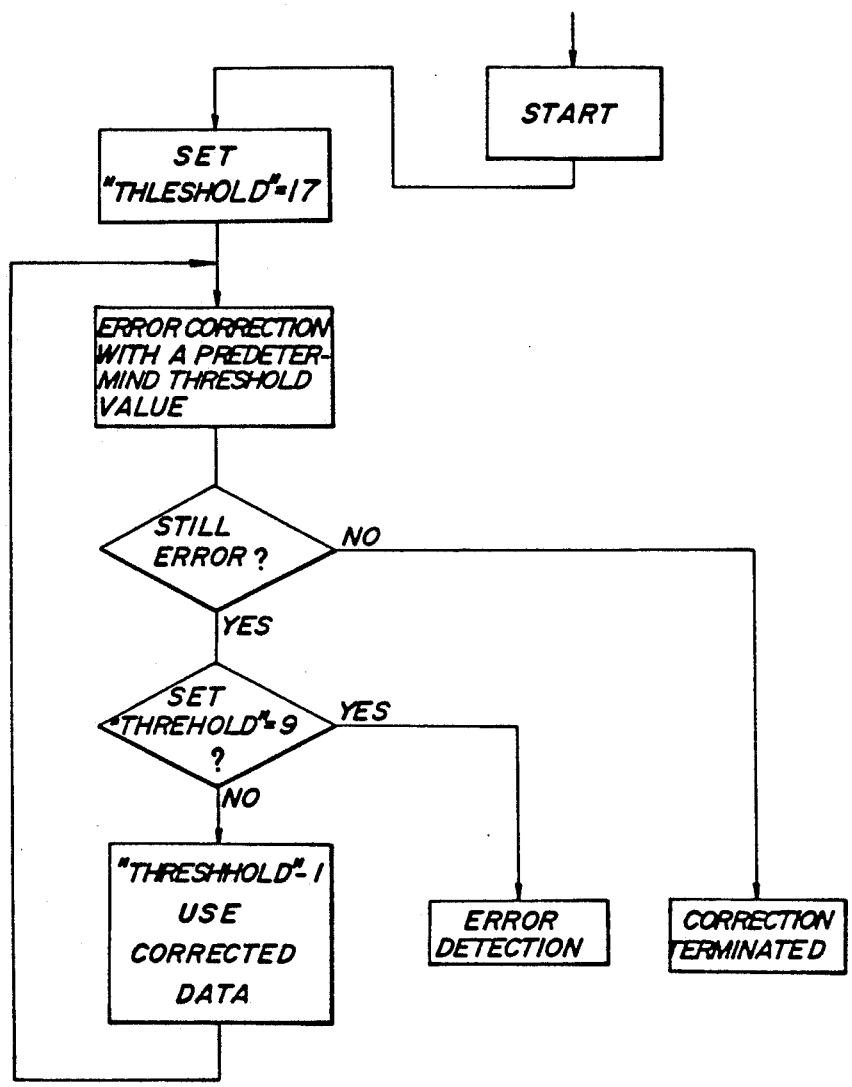
FIG. 22 is a flowchart showing an example of a control procedure for the first embodiment shown in FIG. 21.

FIG. 22 shows the flowchart for is a control procedure of the circuit as shown in FIG. 21. In this case orthogonal parity check sums are used in order to simplify the circuit arrangement. That is, it is not orthogonal on the shortened bit, but it is orthogonal at the leading end of actual transmission bit. Therefore, as described before, the idle operation of the syndrome register, in response to the load end instruction signal, can be eliminated. In other words, the load end signal is not required.

Let $S_0, S_1, \ldots S_{80}, S_{81}$ denote the contents in the syndrome register 1106. Then, the orthogonal parity check sums $A_0, A_1, \ldots, A_{16}$ which are orthogonal at the leading end of transmission bit are given by $$A_0 = S_{16}$$

$$A_1 = S_{70} + S_{75}$$

$$A_2 = S_4 + S_{22}$$

$$A_3 = S_{20} + S_{26} + S_{44}$$

$$A_4 = S_2 + S_{24} + S_{30} + S_{48}$$

$$A_5 = S_{34} + S_{51} + S_{56} + S_{77}$$

$$A_6 = S_7 + S_{43} + S_{60} + S_{64}$$

$$A_7 = S_{15} + S_{19} + S_{41} + S_{47} + S_{65}$$

$$A_8 = S_1 + S_{10} + S_{46} + S_{63} + S_{67}$$

$$A_9 = S_{31} + S_{42} + S_{45} + S_{49} + S_{54}$$

$$A_{10} = S_9 + S_{12} + S_{21} + S_{57} + S_{94} + S_{78}$$

$$A_{11} = S_5 + S_{36} + S_{38} + S_{49} + S_{52} + S_{61}$$

$$A_{12} = S_6 + S_{37} + S_{39} + S_{50} + S_{53} + S_{62}$$

$$A_{13} = S_0 + S_{11} + S_{14} + S_{23} + S_{59} + S_{76} + S_{80}$$

$$A_{14} = S_8 + S_{27} + S_{28} + S_{35} + S_{66} + S_{68} + S_{79}$$

$$A_{15} = S_3 + S_{13} + S_{32} + S_{33} + S_{40} + S_{71} + S_{73}$$

$$A_{16} = S_{17} + S_{18} + S_{25} + S_{56} + S_{58} + S_{69} + S_{72} + S_{81}.$$

Next, the advantage obtained by decrementing the threshold value of the majority logic circuit (like 17, 16, 15, ..., and 9) will be described. For instance, let us consider that the threshold value is 17. Then, when the number of errors is less thsan 16, a wrong correction will not be made. But, when the threshold value is 9, it is possible that a wrong correction occurs. If the shortened bit is eliminated, a matrix A to be composed by orthogonal parity check sums is given by $$A = \begin{pmatrix} & \text{①②③④⑤⑥⑦⑧⑨⑩⑪⑫⑬⑭⑮⑯⑰⑱⑲} & & \cdots & \text{272} \\ \text{①} & 1 & & & \cdots & \\ \text{②} & 1 & & 1 & \cdots & \\ \text{③} & 1 & & & \cdots & \\ \text{④} & 1 & 1 & & \cdots & \\ \text{⑤} & 1 & & & 1 & \cdots \\ \text{⑥} & 1 & & & \cdots & \\ \text{⑦} & 1 & & 1 & 1 & \cdots \\ \text{⑧} & 1 & 1 & & 1 & 1 & 1 & \cdots \\ \text{⑨} & 1 & & & 1 & 1 & \cdots \\ \text{⑩} & 1 & 1 & & \cdots & \\ \text{⑪} & 1 & & & \cdots & \\ \text{⑫} & 1 & & 1 & 1 & \cdots \\ \text{⑬} & 1 & 1 & & \cdots & \\ \text{⑭} & 1 & & & \cdots & \\ \text{⑮} & 1 & & & 1 & 1 & 1 & \cdots \\ \text{⑯} & 1 & 1 & & \cdots & \\ \text{⑰} & 1 & & & \cdots & \end{pmatrix}$$

If there are less than 16 errors except the position of the leading bit, the number of "1"s in the product of an error pattern and the matrix A is 16 at the most. The threshold value is 17, so that no error correction will be made. That is, no wrong correction will be made. If less than 16 errors include the leading bit, the number of "1"s in the product of the error pattern and the matrix A becomes 17. Therefore, if only the leading bit is erroneous, the number becomes 17. If 15 errors are concentrated in each column of the matrix A including the leading bit, the number of "1"s becomes 17. In this case, the leading bit is corrected, so that only the leading bits are properly corrected. The above-described operation is repeated 272 times. Therefore, if the threshold value is 17, some of the errors can be corrected, when there are less than 16 errors, and in this case no wrong correction will be made.

Next, the threshold value is decremented by one to 16, and the same operation as described above is repeated. It is apparent that if there are less than 15 errors, no wrong correction will be made, and some of the errors are corrected.

The threshold value is decreased in like manner to 15, 14, 13, 12, 11 and 10, and the error correction is made. As a result, substantial number of errors (16 bits or 9 bits) can be corrected.

Finally, the threshold value is set to the original value 9, and the error correction is made. In this case, all of the remaining errors less than 8 bits can be corrected, because of the error correcting ability of the code.

As described above, according to the present invention, the threshold value is decreased sequentially from 17 to 9, so that all of less than 8-bit errors and many of 9 through 16 bit errors can be corrected.

Figure 23:
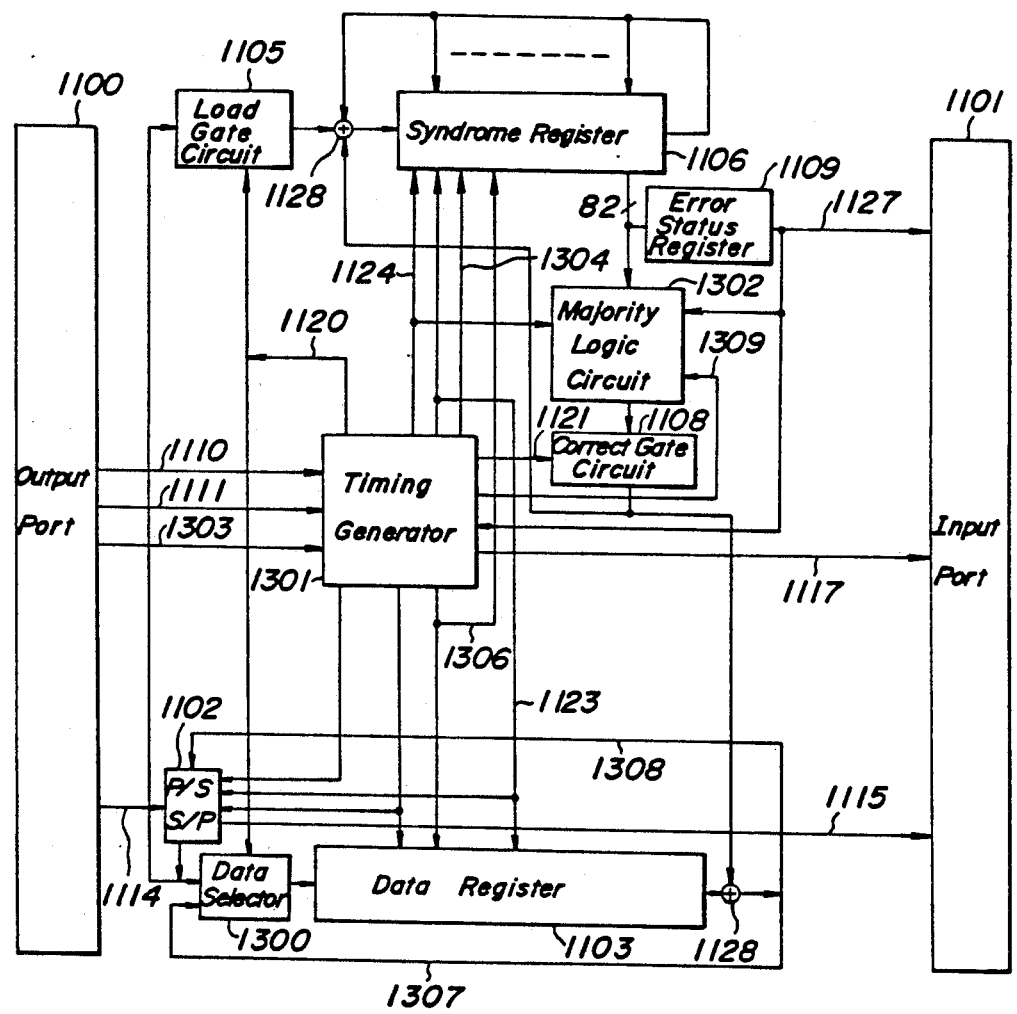
FIG. 23 is a block diagram showing another embodiment of an error correcting and detecting circuit in accordance with the present invention.
Figure 24:
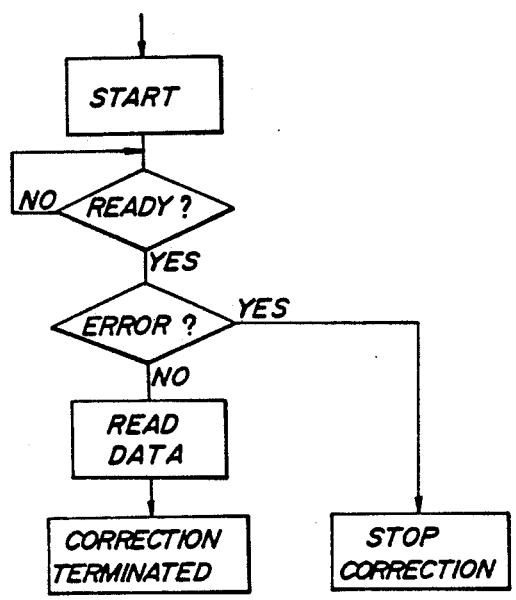
FIG. 24 is a flowchart showing an example of a control procedure for the embodiment shown in FIG. 23.

FIG. 23 shows a further embodiment of the present invention, and FIG. 24 shows a flowchart for explaining the control procedure of the CPU (not shown).

In the error correcting circuit as shown in FIG. 21, the threshold value is set on each occasion, and the data obtained by error correction is loaded again for re-correction. As a result, a relatively long processing time is required. In the error correcting circuit as shown in FIG. 23, almost all the circuit components are hardware, so that the processing times becomes faster. The circuit as shown in FIG. 23 is substantially similar in construction to that as shown in FIG. 21, so that the same reference numerals are used to designate similar parts in both FIGS. 21 and 23, except that the error correcting process and setting of threshold value are automatically done in the embodiment as shown in FIG. 23.

Reference numeral 1300 denotes a data selector; 1301, a timing generator; 1302, a majority logic circuit 1303, a data read signal; 1304, a dummy clock signal; 1305, a data load clock signal; 1306, correction clock signal, 1307, data reserved for the next use; 1308, serial data whose errors have been corrected; and 1309, a timing signal generated at the time point that the testing of one packet data is completed.

As described with reference to FIG. 21, the CPU generates the start signal 1110. In response to this start signal, the timing generator 1301 generates a reset signal 1124, so that the contents of the syndrome register 1106 are all cleared. And at the same time, the threshold value of the majority logic circuit 1302 is set to 17. Thereafter, the CPU sets the data 1114 to be corrected as parallel data, and generates the load signal 1111 so that the data is loaded. In response to the load clock signal 1122, the data is loaded into the parallel-serial converter 1102. After the parallel loading, in response to the load clock signal 1123, the data is loaded into the data register 1103 and the syndrome register 1106. The data selector 1300 is a gate circuit for passing the loaded data when the data is loaded, and for passing the data 1307 to be reserved in the case of the error correction. Thus, the loading of all of the 272 bits in one packet is completed.

After the completion of data loading, the timing generator 1301 generates an error correcting signal. That is, the correction gate 1108 is opened, and in response to the correction clock signal 1306, the syndrome register for error correction. The threshold value first used is 17. As in the case of FIG. 21, all of the 272 bits are subjected to the error correction. In this case, the data (272 bits) which has been corrected with the threshold value of 17 is left in the data register 1103.

In this stage, if the error status signal 1127 shows an error, the data which is stored in the data register 1103 is still erroneous. Therefore, the threshold value is decremented by one, and the error correction is repeated.

The majority logic circuit 1302 receives the error status signal 1127. When it detects that there still exist some errors, the threshold value is decremented by one in response to the timing of the one packet end signal. The period of the syndrome register 1106 is 273 bits, so that in response to the dummy clock signal 1304, the contents of the syndrome register 1106 are shifted by one bit. Thereafter, the error correction is continued using the threshold value of 16.

When the error status signal 1127 shows that all the errors have been corrected, the CPU enters the reading cycle of the data.

If all the errors have not been corrected, even when the threshold value is decreased to 9, the error status signal 1127 indicates an error, and the ready signal 1117 is generated.

In response to the data read signal 1303, the data is read out. In response to the data read clock signal 1305, the data in the data register 1103 is transferred into the serial-parallel converter 1102. In response to the ready signal 1117, the CPU repeatedly outputs the data read signal 1303 for reading in the parallel data 1115, so that after the error correction, the data of one packet is restored.

Figure 25:
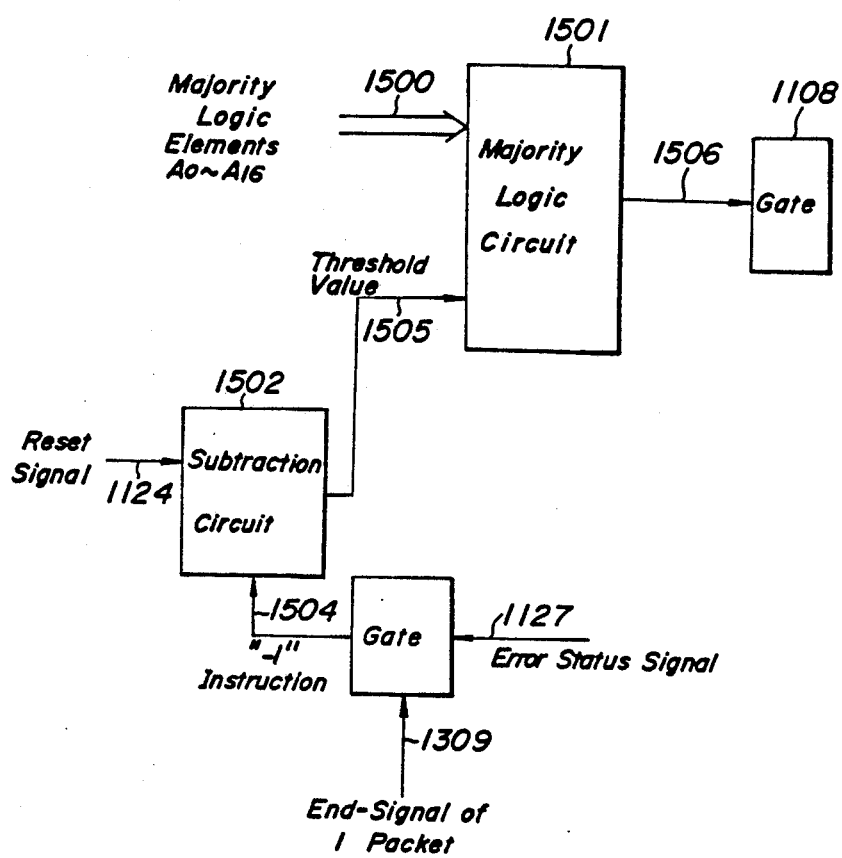
FIG. 25 is an explanatory diagram used to explain operation of a majority logic circuit.

FIG. 25 is a block diagram used to explain the operation of the majority logic circuit. Reference numeral 1500 denotes the input signal of majority logic elements ($A_0$ through $A_{16}$) to a majority logic circuit 1501, 1502, a subtractors; 1503, a gate circuit; 1504, a subtraction instruction signal for decrementing the threshold value by one; 1505, a threshold value signal; 1506, an output from the majority logic circuit 1501. As described before, the reference numeral 1108 denotes a correction gate circuit; 1124, a reset signal; 1127, an error status signal; 1309, one packet end signal.

In reponse to the reset signal 1124, the subtractor 1502 is set to 17. That is, the first threshold value is 17. When 272 bits are corrected once one bit by one bit, in respone to the the one packet end signal 1309, the gate 1503 is enabled, so that the error status signal 1127 passes through it. In response to the subtraction instruction signal 1504, the initial threshold value 17 is decremented by one to 16, and the threshold value signal 1505 is transmitted. The majority logic circuit 1501 delivers the output signal 1506, only when the input signals $A_0$ through $A_{16}$ are greater than a predetermined threshold value indicated by the thresold value signal 1505. The above described operation is carried out for each bit, whereby the operation with the threshold value 16 is accomplished.

The similar operation is repeated as to the threshold values of 15 through 9.

In the embodiments as shown in FIGS. 21 and 23, the threshold value is decreased sequentially from 17 to 9 for error correction. But, if intermediate threshold values 11, 10 and 9 are selected as a first threshold value, the processing time can be shortened. In this case, the error correcting ability is slightly degraded. Furthermore, if the threshold value is decreased like 17, 15, 13, 11 and 9, the error correction time can be also shortened.

As described above, all of less than 9 bit errors can be completely corrected, and many portion of 16 through 9 bit errors can be corrected. Thus, the teletext broadcasting service area can be increased, and erroneous displays can be minimized. According to a computer simulation, in cases of 9 and 10 bits, the errors are perfectly corrected by 100%, and in the case of 11 bits, the errors are corrected by 95%.

In the embodiment as shown in FIG. 21, only the threshold value is designated from the exterior without modifying the fundamental error correcting circuit, so that there is the advantage that the present invention can be carried out in simple manner only by adding some software to the conventional circuit.

In the case of the embodiment as shown in FIG. 23, the software used in the embodiment as shown in FIG. 21 is replaced by hardware, so that fast processing becomes possible.

In the last embodiment, the number of threshold values which are gradually decreased is diminished, so that the time required for error correction can be shortened.

The embodiments described above with reference to FIGS. 21 through 25 can be applied to the teletext broadcasting system utilizing the vertical blanking period of the television signal, but it is to be understood that the present invention may be equally applied to an exclusive type of code broadcasting system, in which all of the horizontal line are used. Furthermore, the present invention may be equally applied to a decoding circuit for other majority logic decodable code.

The embodiments described above with reference to FIGS. 1 through 25 have a common disadvantage, that there exist some errors that cannot be detected. Therefore, referring to FIGS. 26 through 29, an error detecting circuit will be described, in which a probability of erroneous correction can be reduced.

Figure 26:
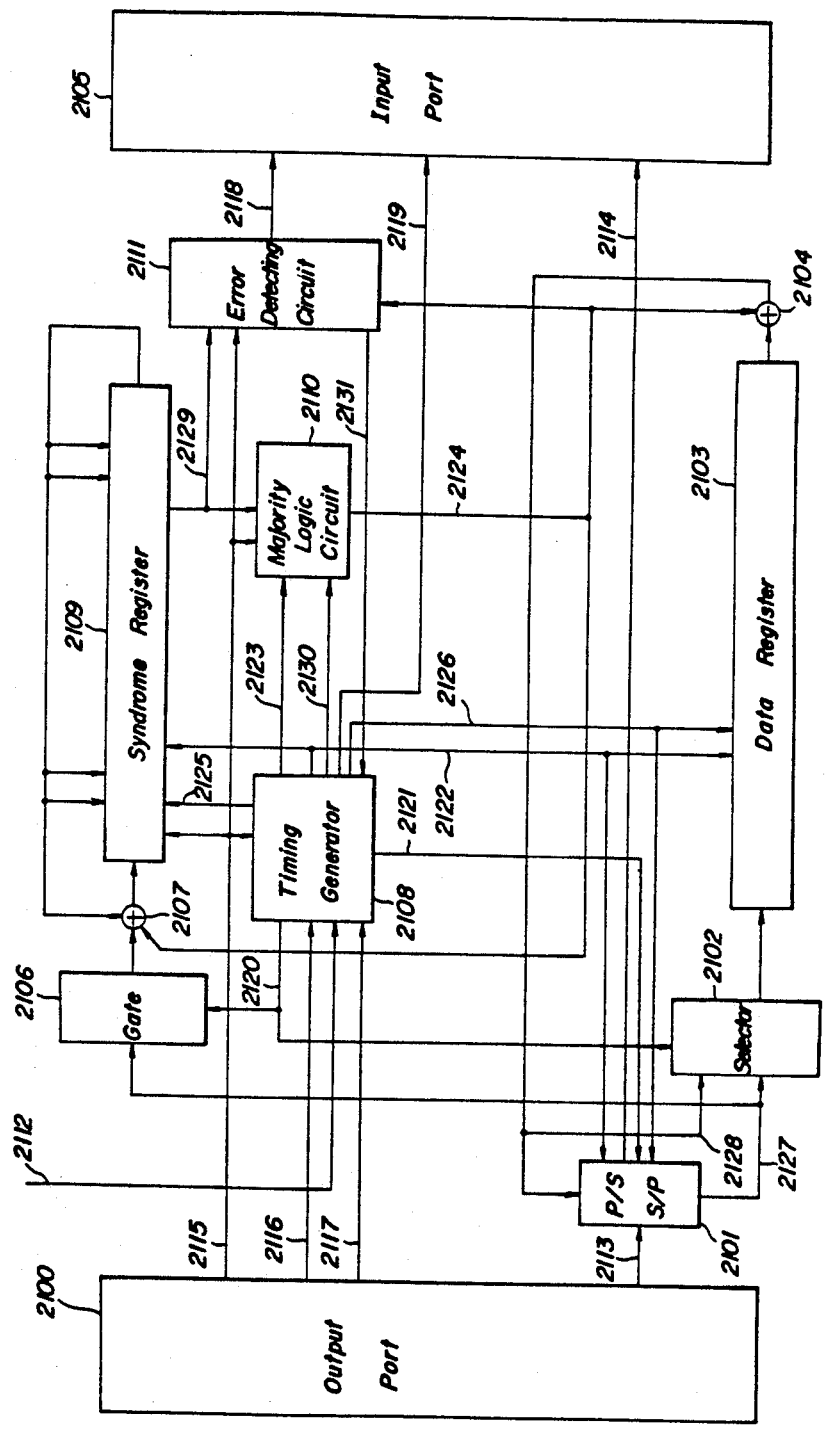
FIG. 26 is a block diagram showing an embodiment of an error detecting circuit in accordance with the present invention.
Figure 28A:
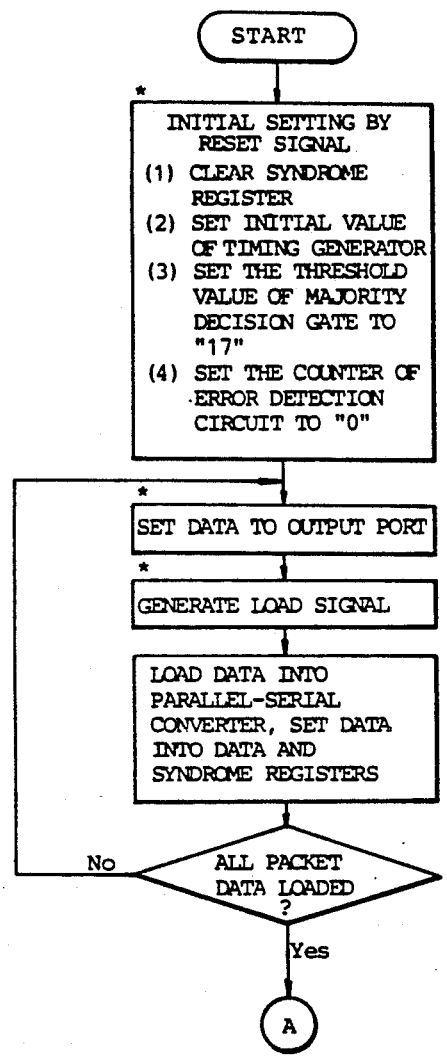
FIGS. 28A, 28B, 28C and 28D are flowcharts showing an example of the operation procedure of the embodiment shown in FIG. 21.
Figure 28B:
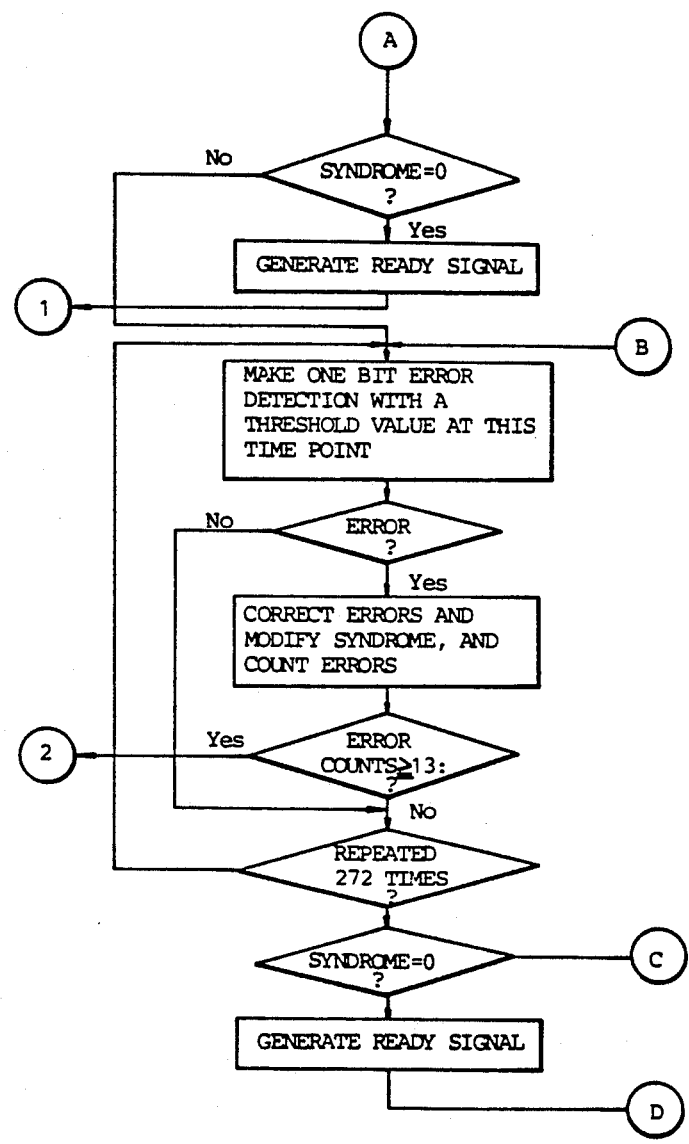
Figure 28C:
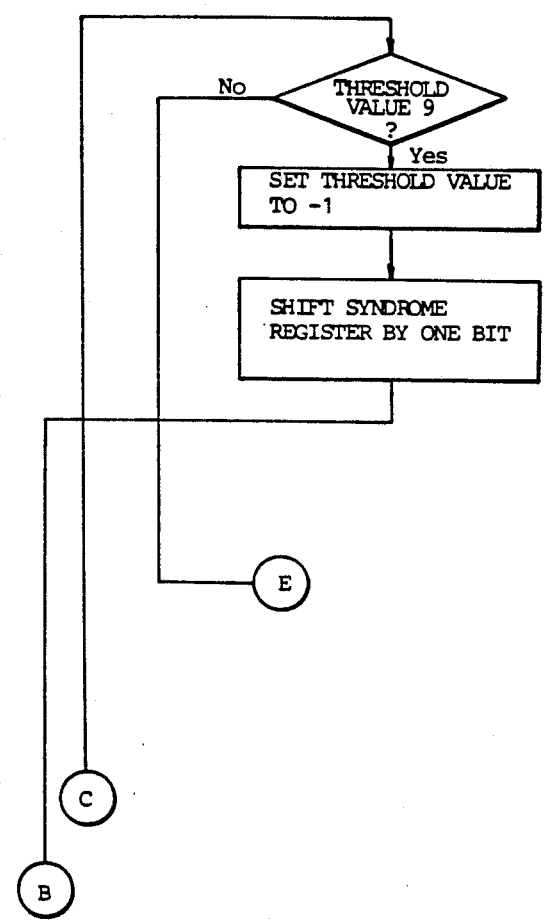
Figure 28D:
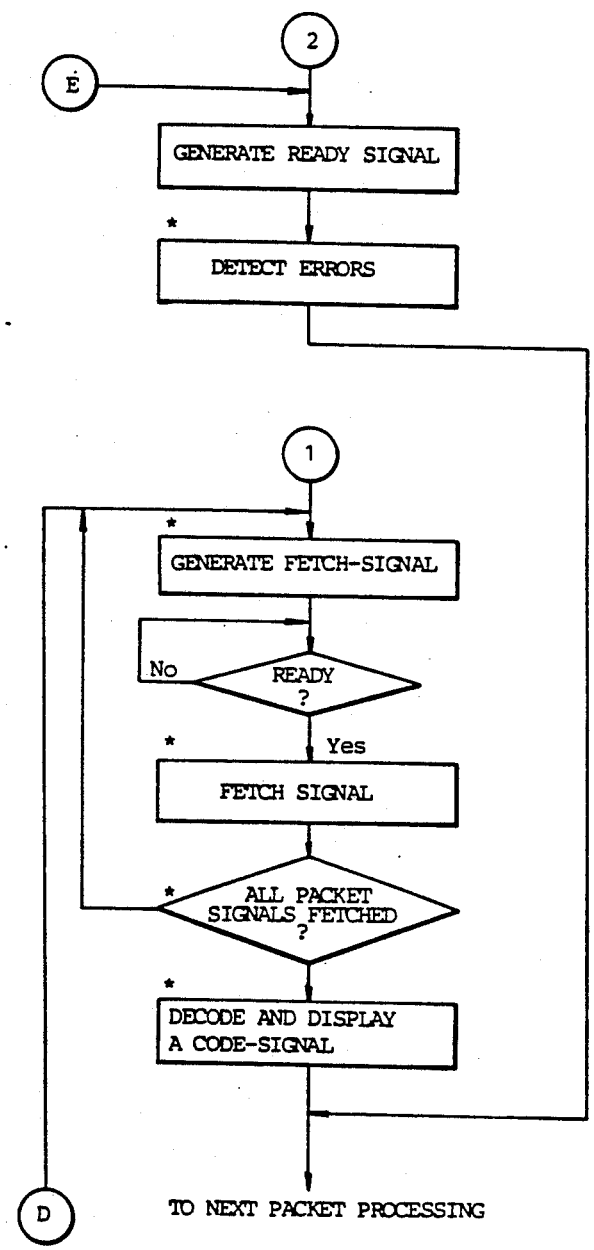

FIG. 26 shows one embodiment of an error detecting circuit in accordance with the present invention. FIG. 27 shows the result of the simulation, when a error correction is made while the threshold value is being decreased; that is, FIG. 27 shows the differences between the correcting ability with the initial threshold value. In FIG. 27, 1 indicates the initial threshold value of the majority logic circuit.

FIGS. 28A through 28D show a flowchart for controlling the embodiment as shown in FIG. 26. In these figures, the blocks marked with * are carried out by the CPU. The remaining steps are automatically carried out by the circuit. The steps as shown in FIG. 28 will be explained, in conjunction with the description of the embodiment as shown in FIG. 26.

In FIG. 26, reference numeral 2100 denotes a CPU output port (the CPU is not shown); 2101, a parallel-serial/serial-parallel converter; 2102, a selector; 2103, a data register (272 bits); 2104, a modulo-two adder; 2105, a CPU input port, 2106, a gate; 2107, a modulo-two adder; 2108, a timing generator; 2109, a syndrome register (28 bits); 2110, a majority logic circuit or majority decision circuit 2111, an error detecting circuit; 2112, a clock signal; 2113, data to be corrected; 2114, data which has been corrected; 2115, a reset signal; 2116, a load signal; 2117, a fetch signal; 2118, an error status signal, 2119, a ready signal; 2120, a data load control signal; 2121, a data load pulse signal; 2122, a data load clock signal; 2123, an error correcting gate signal; 2124, an error correcting signal; 2125, a syndrome shift clock signal; 2126, a fetch clock signal; 2127, a serial load data; 2128, a cyclic data; 2929, a syndrome register signal; 2130, a threshold value decrement signal; 2131, an error-correcting impossible signal.

The CPU receives a packet signal, and starts the process of error correction. First, the CPU generates a reset signal 2115. Consequently, 82 bits of the syndrome register 2109 are all set to "0"; the timing generator 2108 is set to the initial state; the threshold value of the majority logic circuit 2110 is set to the initial value of 17; and an error correction counter included in the error detecting circuit 2111 is set to "0". Thus, they are ready to receive the data.

Thereafter, the CPU loads a received packet signal (that is, data 2113 to be corrected) into the parallel-serial converter 2101. If the converter 2101 consists of 8 bits, the packet signal is loaded 34 times, but if the converter 2101 consists of 16 bits, the packet signal is loaded 17 times. The loading is carried out in response to the load signal 2116.

Upon reception of the load signal 2116, the timing generator 2108 generates the data load pulse signal 2121, so that the data 2113 to be corrected is set into the register of the converter 2101. In response to the data load clock signal 2122, the data in the converter 2101 is transferred into the data register 2103 and the syndrome register 2109. In this case, in response to the data load control signal 2120, the date 2106 is controlled, so that the serial load data 2127 may pass through it. The data selector 2102 is set to the mode for selecting the serial load data 2127. Of course, if the converter 2101 consists of 8 bits, the number of pulses of the load clock signal is 8 bits. If the converter 2101 consists of 16 bits, the number of pulses of the load clock signal is 16 bits. In the case of loading, the majority logic circuit 2110 is inhibited (that is, disenabled) in response to the error correcting gate signal 2123, so that the error correcting signal 2124 is not outputted.

When all the data has been loaded into the data register 2103 and the syndrome register 2109, the circuit automatically initiates the error correcting operation. For the first time, in response to the control signal (error correcting gate signal) 2123, the majority logic circuit is enabled with the threshold value of 17, and delivers the error correcting signal 2124. When data contains no error at all, the error detecting circuit 2111 detects no error in response to the signal from the syndrome register signal 2129. As a result, no error correction is made. In response to the error status signal 2118, CPU detects that there is no error, so that the received packet signal stored in CPU is restored.

In the case of the error correction, the clock signal is supplied by the data load clock signal 2122. When "a clock signal consisting of 272 bits as one cycle" is delivered, in response to the one bit clock of the syndrome shift clock signal 2125, only the contents of the syndrome register 2109 are shifted by one bit. In this case, the error correcting gate signal 2123 is turned off, so that no error correction is made. The reason is that the period of the syndrome "273" is different from the data period "272". When all the errors are corrected in a cyclic operation, the error status signal 2118 represents that there exists no error, and in response to the ready signal 2119, the data is fetched into the CPU. Therfore, is suffices for the CPU to watch the ready signal 2119 always. The ready signal 2119 may be supplied to an interrupt control line, so that the CPU may be informed.

The corrected data (cyclic data) 2128 which has passed the modulo-two adder 2104 passes through the data selector 2102, and is re-loaded into the data register 2103. The error detecting circuit 2111 includes a counter for counting the error correcting signal 2124.

When this counter indicates 13, the impossible signal for error correction 2131 outputted, so that the error status signal 2118 normally represents the error detection.

In response to the above-described signal 2131, the generator 2108 delivers the ready signal 2119 at the point where one cyclic bit shift has been completed. The CPU judges that there exists an error, in response to the error status signal 2118. Therefore, this packet is not used.

When the error correction is not accomplished during one cyclic data shift (that is, when all the contents of the syndrome register 2109 are not "0", or when the error correcting signal is not repeated more than or equal to 12 times), in response to the decrement signal for threshold value 2130 from the timing generator 2108, the threshold value of the majority logic circuit 2110 is decremented by one to 16, and the above-described operation is again repeated. If such an operation is repeated, there exists a chance that all the errors cannot be completely corrected. In this case, the threshold value us gradually decreased, until the operation with the threshold value 9 is accomplished. At this time point, if the error status signal 2118 does not represent that there exists no error, an error is detected, so that this data will not be used. In this case, in response to the ready signal 2119 and the error status signal 2118, the CPU knows of the error detection.

When the error correction is completed in the midway (that is, when the contents of the syndrome register become all "0", and the error correcting signal is outputted less than or equal to 12 times), the ready signal 2119 is delivered simultaneous with the completion of the 272 bit shift as to that threshold value. Therefore, in response to the error status signal 2118, the CPU judges that all the errors have been corrected.

The reason why the counted number of the error correcting signals is fixed to "12" for error detection is that, in the method in which the error correction is made by gradually decreasing the threshold value to less than or equal to 10 bit errors can be completely corrected in all the cases, and the 11 bit errors can be corrected by 90%. FIG. 27 shows the results of the computer simulation.

When the error correction is accomplished (that is, when the contents of the syndrome register 2109 are all "0", and the error correction counts is less than or equal to 11), the CPU delivers the fetch signal, so as to read the corrected data. In response to the fetch signal, the state of the ready signal 2119 temporarily becomes busy, but when the data is set into the serial-parallel converter 2101, the ready signal 2119 appears again. In response to the ready signal 2119, the CPU receives the data from the converter 2101. The required data has a length of 190 bits, so that if 8 bits are fetched simultaneously, the fetch signal is generated 24 times, but if 16 bits are fetched in one time, the fetch signal is generated 12 times. After the data of 190 bits has been fetched, the CPU interprets and displays the data, thereafter becomes ready for receiving the next packet.

Next, a further embodiment of an error detecting circuit in accordance with the present invention will be described.

In the embodiment (the error detecting circuit) as shown in FIG. 26, provided that the contents of the syndrome registers 2109 are all "0" and when the error correction counts is less than or equal to 11, the error correction is judged as being correctly carried out. But, it is to be understood that the probability, that a packet signal can be correctly corrected and restored, would be increased by increasing the limitation of the error counts or varying the error counts. However, in this case, undetectable error increased, so that it is required to check the errors in the data position by using the CRC (Cyclic Redundancy Check).

Figure 29:
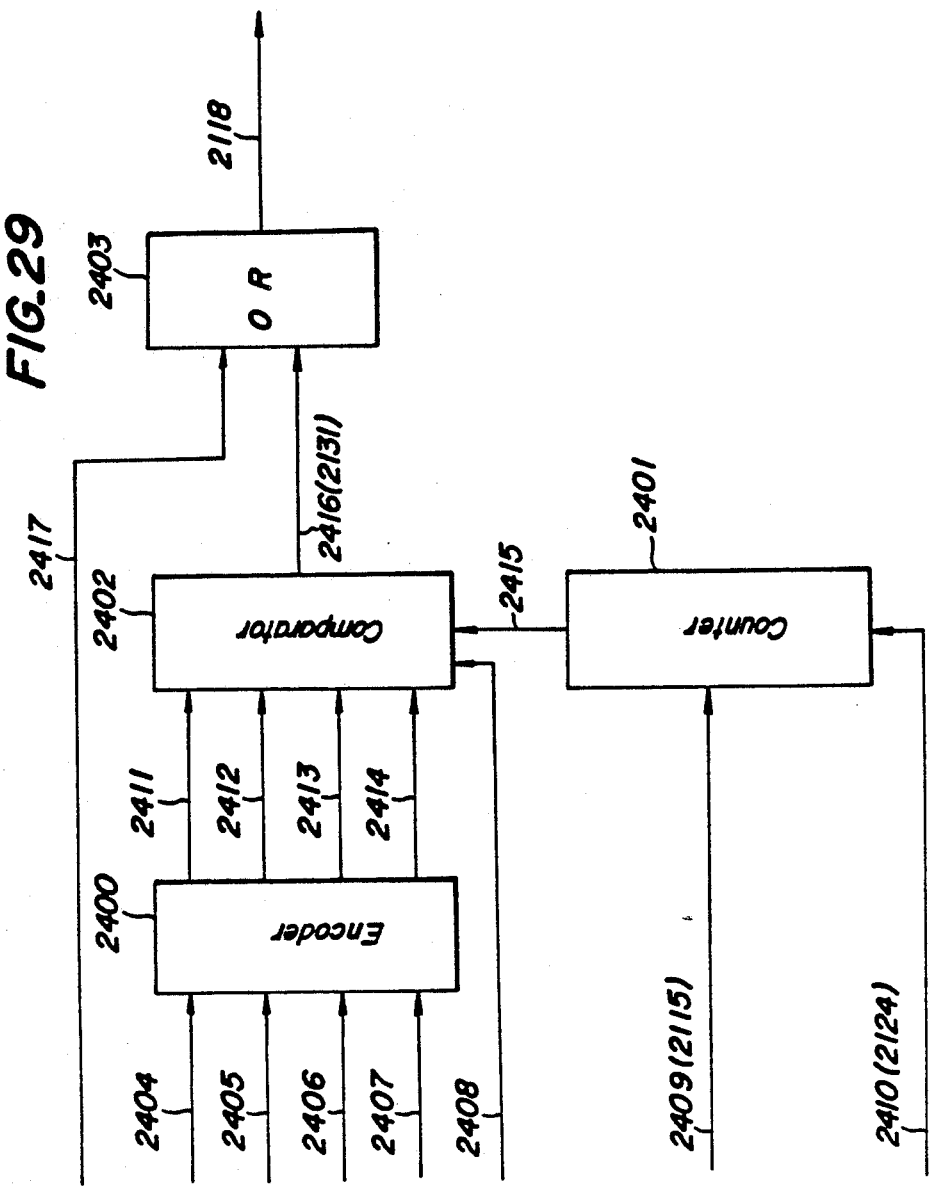
FIG. 29 is a block diagram showing another embodiment of an error detection circuit.

FIG. 29 shows a further embodiment of an error detecting circuit in accordance with the present invention. Reference numeral 2400 represents an encoder; 2401, a counter; 2402, a comparator; 2403, a logic OR gate; 2404, a signal derived from a push-button switch (not shown) which shows "11"; 2405, 2406, and 2407, signals from push-button switches showing "12", "13" and "14", respectively; 2408, a signal derived from a push-button switch displaying the meaning of a limitless; 2409, a reset signal similar to the reset signal 2115 as shown in FIG. 26; 2410, an error correcting signal similar to the signal 2124 as shown in FIG. 26; 2411 through 2414, the encoded outputs from the encoder 2400; 2415, an output signal from the counter 2401; 2416 (which is similar to the signal 2131 as shown in FIG. 26), an error detecting signal which is outputted in response to the number of error corrections; and 2417, an error detecting signal derived from the syndrome register.

In response to the push-button signal 2404 through 2408, one of the them becomes "1" in response to an external switch, thus a threshold level for judging the error detection is designated. For instance, if the push-button signal 2404 is set to "1", the output signal 2411 through 2414 from the encoder 2400 represents "11". That is, the signal 2411 becomes "1"; the signal 2412, "1"; the signal 2413, "0"; and the signal 2412, "1". These encoded signals are applied to the comparator 2402.

Reference numeral 2409 indicates a reset signal, and is delivered when the error correction is started. In response to the reset signal 2409, the counter 2401 is initially set to "0". Under these conditions, the operation for correcting the errors of a packet signal is started. Then, the counter input signal (that is, the error correcting signal) is inputted for error correction, so that the counter 2401 is counted up. When the counted number exceeds the value designated by the encoded signals 2411 through 2414, the comparator output signal 2416 becomes "1". Even if the error detecting signal 2417 from the syndrome register is "0" (that is, when the contents of the syndrome register are all "0"), the comparator output signal 2416 which has passed the logic OR gate 2403 appears as an error status signal 2118 "1". Thus, the error detection is displayed.

When the push-button signal showing "limitless" becomes "1", the error detecting operation is halted in a special case, that is, when the value of one input to the comparator 2402 is set to the value that exceeds the number 272, or when it is so directly controlled that the output signal 2416 from the comparator 2402 will not become "1". Therefore, the circuit as shown in FIG. 29 functions in a manner substantially similar to that described above with reference to FIGS. 21 through 25. In this case, the error-correction probability can be increased, but naturally the erroneous-correction probability will be increased. Therefore, the error detection function by CRC becomes more important.

As described above, the value designated by the push-button signals 2404 through 2407 has been described as being incremented by one, but it is to be understood that the same function can be attained by incrementing by "2", "3", "4" .... That is, the designated number may be not four, but may be more than or equal to five, or less than or equal to three. Even so, the same function can be obtained. It is also apparent that the same function or effect can be attained, even if the push-button signals 2404 through 2408 are selected in response to an instruction from the CPU.

A further embodiment of an error detecting circuit in accordance with the present invention will be described.

In the embodiment described above, if error detecting signals 2416 and 2417 are set as other flags (cf. FIG. 29) which then are identified by the CPU, the same effect can be obtained. Whether or not only the error detecting signal 2417 from the syndrome register is used for the basis of detecting errors by the CPU, or whether or not the error detecting signal 2416 depending on the number of error corrections should be included in the information for identifying the error detection by the CPU, may be selected depending upon a user's program.

Finally, the fourth embodiment (an error detecting circuit) in accordance with the present invention will be described.

In the third embodiment described above, the CPU may be so designated and constructed that it can directly identify the output data from the counter 2401 without regard for the error detecting signal 2416. Therefore, it can be decided by software whether or not the corrected data could be used.

In the case of the framing timing detection to be described below with reference to FIGS. 30 through 40, the threshold level is different from the threshold level of the error detection of the normal packet signal. If the CPU reads out the count number, whether the framing timing is correct or not can be determined by the error detecting signal 2417 and a program. In this case, the comparison by means of a comparator is not needed, of course, so that the error correction is carried out to the last stage (that is, until the threshold value "9" is reached). Furthermore, the error detection rate is always counted and controlled by software, so that the threshold level in error detection is controlled. Thus, regardless of the reception conditions, the error correction probability can be maintained at a predetermined level. There is also an advantage that by utilizing the count number of error corrections, the adjustment of the slice level in a signal discrimination circuit and the adjustment of the sample phase can be made. And, the count number of error corrections can be used as a feedback information to a wave equalizer or the like.

Since each of the embodiments described above is based on the error correcting circuits described with reference to FIGS. 21 through 25, so that an error correcting effect substantially similar to that described above can be attained, by not setting the threshold value of the majority logic circuit to "17" but to "13", or by varying the threshold value not to "−1" but to "−2", "−3", etc. furthermore, by repeating the error correcting operation, until no error correction is required at a predetermined threshold value, then by effecting the subtraction of the threshold value only when the error correction signal disappears.

As described above, the probable or rough counter number of the error correction bits can be identified by carrying out the present invention described with reference to FIGS. 26 through 29, so that the probability of wrong error correction can be reduced.

Next, the effects of the embodiments described above are summarized.

According to the first embodiment, the logic OR operation of the error detection from the syndrome register and the error detection obtained by counting the error correction bits is obtained, and transmitted as a flag to the CPU, so that not only the circuit but also the program can be simplified.

Accordng to the second embodiment, the threshold value of the count number of the error correction bits is variable, and is determined by the exterior push-buttons, a device including an A/D converter and the CPU, so that the threshold value of the count number of the error correction bits is increased in a poor reception area or field. Therefore, the reception probability in the poor reception area or field can be increased.

According to the third embodiment, the error detection from the syndrome register and the error detection due to the counting of the number of the error correction bits are transmitted to the CPU as different flags, so that the determination of the error correction is made by the CPU. Depending upon the purpose for use, it is possible to neglect the error detection due to the counting of error correction bits.

According to the fourth embodiment, it is so designed and constructed that the output from the counter representative of the count number of error correction bits is directly transmitted to the CPU, thus the threshold value of the error detection can be determined by software. The count number of the error correction can be applied to a signal discrimination circuit, a wave equalizer or the like. In this case, the threshold value to the comparator is not required to be determined directly by using the push-buttons or by the CPU. If the comparator input is applied to the CPU as a status signal a construction similar to the above described first, second and third embodiments can be obtained, by the comparison with the counter output by software.

As described above, according to the present invention described with reference to FIGS. 26 through 29, the number of error correction bits is counted. Then, if the number of the counts is large, it is treated that "the error detection" occurs, even if the contents of the syndrome register are all "0", whereby the erroneous correction probability is reduced. Furthermore, according to the present invention, not only all the majority logic decodable error correcting codes, but also other signals, are able to have the function of the error detection.

Next, referring to FIGS. 30 through 40, the framing synchronizing reproduction for showing the start of the codes in a packet will be described.

Figure 30:
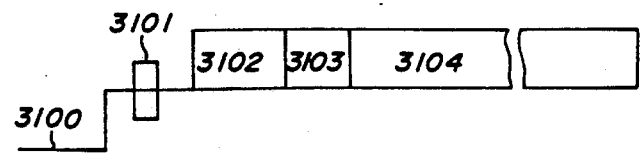
FIG. 30 is a diagram showing the format of a character code signal to be transmitted.

FIG. 30 shows the composition of a transmission signal for a teletext broadcasting code. Reference numeral 3100 denotes a horizontal syncronous signal; 3101, a colour burst signal; 3102, a clock-run-in signal; 3103, a framing code signal; 3104, a character code signal to be transmitted consisting of 272 bits. In the case of reception, the clock synchronization is secured in response to the clock-run-in signal 3102, which is superposed on each line and transmitted, then the framing timing is determined in response to the framing code signal 3103. Thus, the character code signal 3104 is sequentially fetched from its leading bit.

Figure 31:
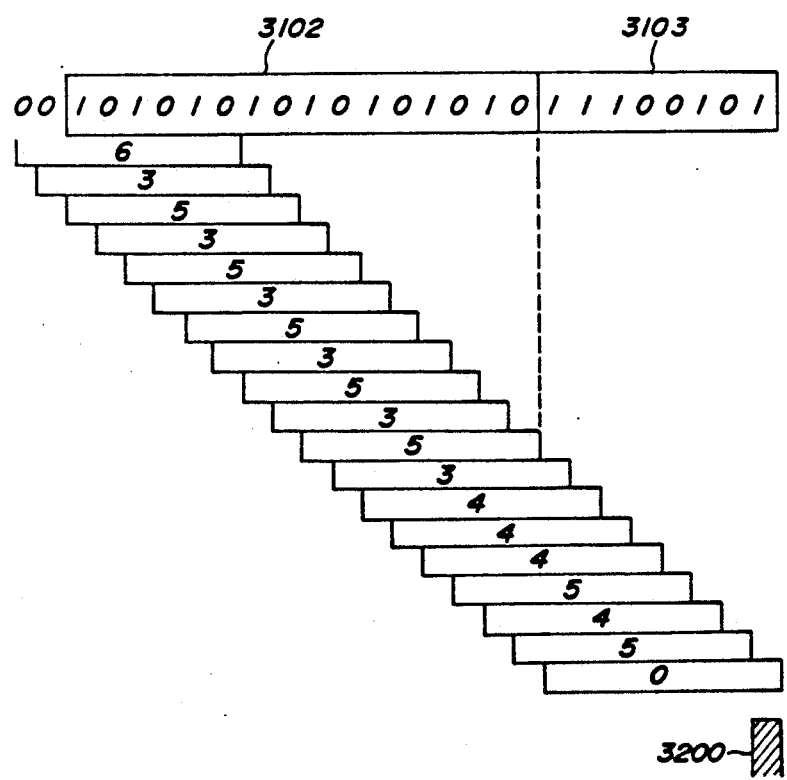
FIG. 31 is an explanatory diagram used to explain the underlying principle of the framing timing extraction according to the present invention.

FIG. 31 shows the underlying principle of the extraction of the framing timing, and shows the distance of the code between the framing code and the received 8-bit signal. Until a correct framing code is received, the minimum distance of the code is "3", so that it is possible to extract the correct framing timing, even if there exists one bit error. In FIG. 31, the reference numerals 3102 and 3103 represent the clock-run-in signal and the framing code signal, respectively; and 3200, a framing timing.

A first embodiment of a framing timing detection circuit in accordance with the present invention will be described with reference to FIGS. 32 through 38.

Figure 32:
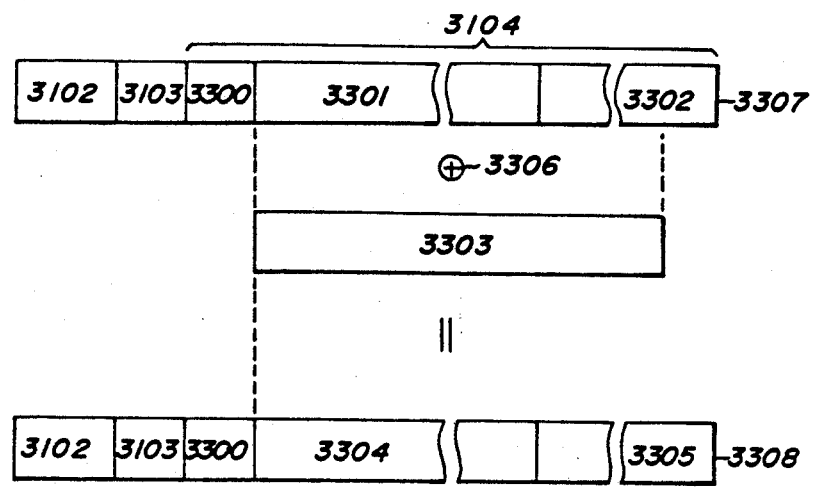
FIG. 32 is a diagram illustrating a signal to be transmitted in accordance with the present invention.

FIG. 32 shows the composition of the transmitted signal of the embodiment. Reference numeral 3300 denotes a service discrimination and interruption signal; 3301, a information portion of a character code (182 bits); 3302, an error correcting parity signal (82 bits); 3303, an 8-bit M-sequence pseudo random pulse signal (255 bits, which will be referred to as "PN" signal in this specification); 3304, a character code information portion after adding the PN signal; 3305, a parity signal after adding the PN signal; 3306, an exclusive OR operatior; 3307, a packet signal before adding the PN signal; and 3308, a packet signal after adding the PN signal.

As described above, in the case of the Japanese character code broadcasting, the (272,190) error correcting system is considered to be optimum. Therefore, as shown in FIG. 32, the character code signal 3104 is transmitted. That is, the service discrimination and interruption signal 3300 and the character code information portion 3301 act as the error correcting code of 190 bits.

According to this framing timing detection circuit, a strong framing timing extraction can be carried out by utilizing the fact, that the new error correcting system is provided with the capability of error detection, and that when the PN signal 3303 slips the bit errors are reduced almost one half.

Therefore, the exclusive-OR of the packet signal 3307 without the PN signal and the PN signal 3303 si obtained one bit by one bit, and converted into the packet signal 3308. The service discrimination and interruption signal 3300, which is converted into the error correcting code by the (8, 4) extended Hamming code, is transmitted without any modification or conversion, in view of the relationship with other systems. In the case of the pattern method of character broadcasting system, in response to the service discrimination and interruption signal 3300, the signal 3300 can be decoded in a manner substantially similar to the conventional manner.

Next, the signal processing in the receiver will be described.

Figure 33:
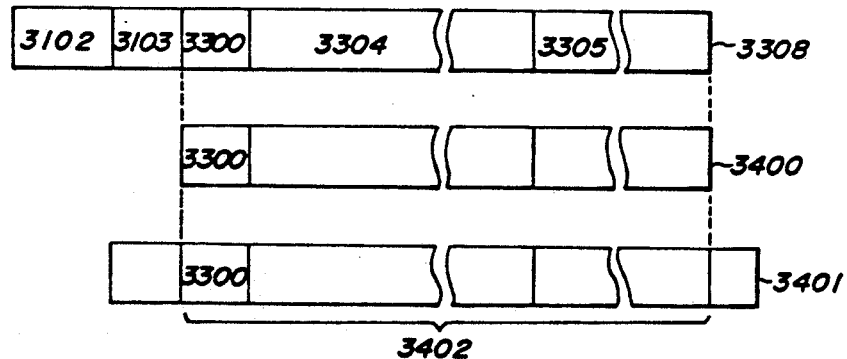
FIG. 33 is a diagram illustrating a packet signal loaded in a CPU.

FIG. 33 shows the packet signal received by the CPU. Reference numeral 3400 denotes a fetch signal related to the detection of the conventional framing code; and 3401, a signal including a framing code used by this embodiment of the present invention and consisting of 36 bytes. The signal which is actually required is the signal 3402 consisting of 34 bytes.

In the receiver, the framing timing of the 36 byte signal 3401 fetched into the CPU is detected, in the process of the error correcting operation. First, the leading end of the received signal 3401 is treated as the framing timing, and an operation which is the reverse to the transmitting operation is carried out, so that 34 bytes (272 bits) are applied to the error correction circuit. If there exist many errors, the framing timing is identified as being not correct. Next, the position after shifting one bit is regarded as the framing timing, and the same operation is repeated. The above-described operation is repeated.

When the correct framing timing is obtained, there exist the least number of error bits. Therefore, the leading timing of the signal 3401 is set to a suitable timing, after the clock-run-in signal 3102 has been detected. But, it must be fetched in such a way that all 34 bytes are included, therefore as shown by the signal 3401, it is suitable to fetch the 36 byte data from the position that is one byte before the framing timing.

In general, the autocorrelation of the repeating pattern as to the M-sequence signal is "$2^n - 1$" when no bit is shifted, and is "$-1$" in the other cases, where n represents the order of the M-sequence. Therefore, in the case of 8 bits in accordance with this embodiment, n becomes eight, so that the number of coincidence bits becomes "255" when no shift is made. In the case of other shifts, the number of coincidence bits is "127" ($[2^n - 1]/2]$), and the number of in-coincidence bits becomes "128" ($[2^n - 1]/2] + 1$). That is, when no shift is made, there is not error bit (in-coincidence bit), while in the other cases, the number of error bits becomes "128".

According to this embodiment, if an correct framing timing cannot be attained, the average of 218 error bits occurs. Of course, in the case of the correct framing timing, the number of error bits is 0.

Figure 34:
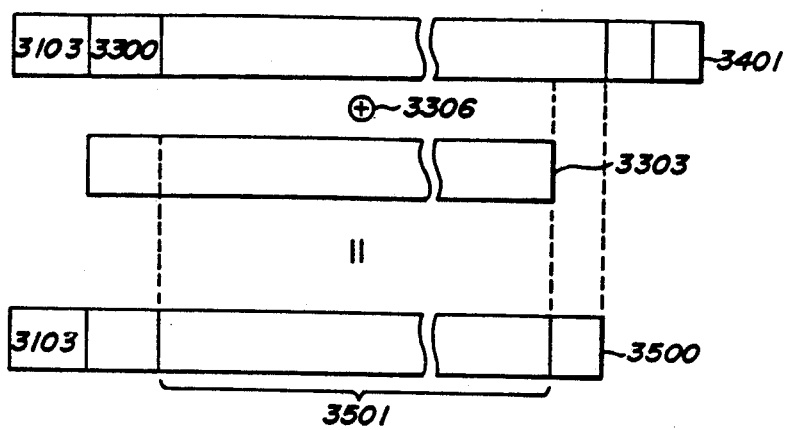
FIG. 34 is an explanatory diagram used to explain the bit operation (erroneous framing timing) on the receiving side.
Figure 35:
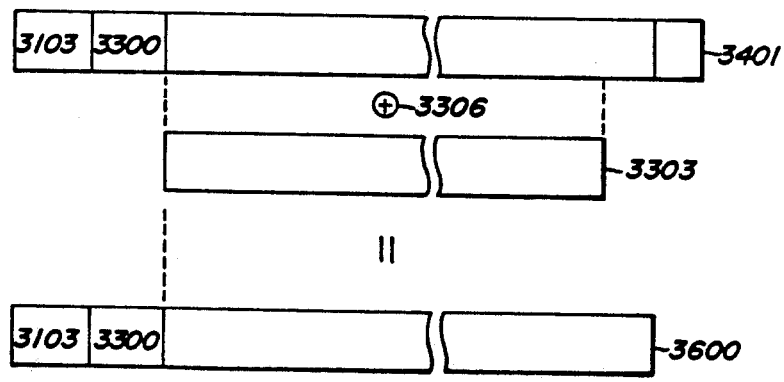
FIG. 35 is an explanatory diagram used to explain the bit operation (correct framing time) on the receiving side.

FIG. 34 shows a 34 byte packet signal, in the case of an erroneous framing timing (that is, 8 bits before the correct framing timing). Reference numberal 3500 represents a packet signal, which is added with the PN signal, in the receiver. And $255 - 8 = 247$ bits are included in the signal section 3501, then about half of these bits are erroneous. Thus, even if the packet signal 3500 is loaded into the (272,190) error correcting circuit for decoding, in almost all the cases, it becomes impossible to decode because of many errors.

Therefore, the data is shifted one bit by one bit, and the operation described above with reference to FIG. 34 is repeated. Then, the correct timing packet signal 3600 can be obtained at the 8-th bit. That is, the signal 3600 has no error. In practice, errors caused in a transmission path are added. If the errors caused by the transmission path are less than or equal to 8 bits, the complete correction is possible by the (272,190) error correcting circuit, and the original packet signal per se is restored.

Figure 36A:
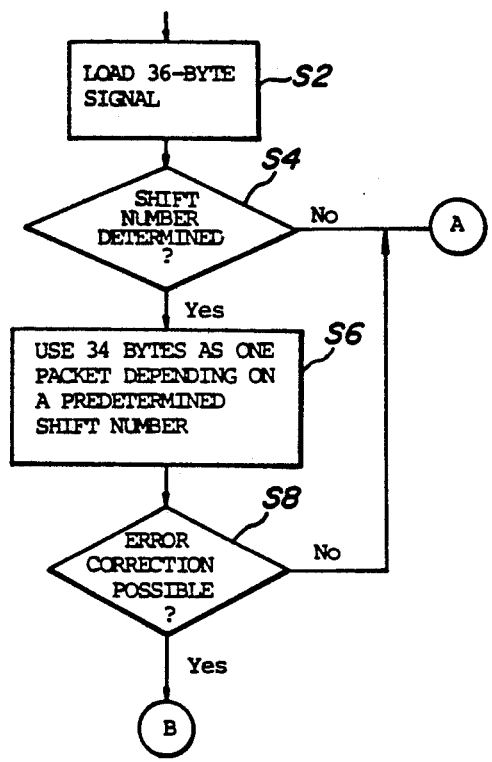
FIGS. 36A and 36B are flowcharts showing an example of a packet signal error correction procedure in accordance with the present invention.
Figure 36B:
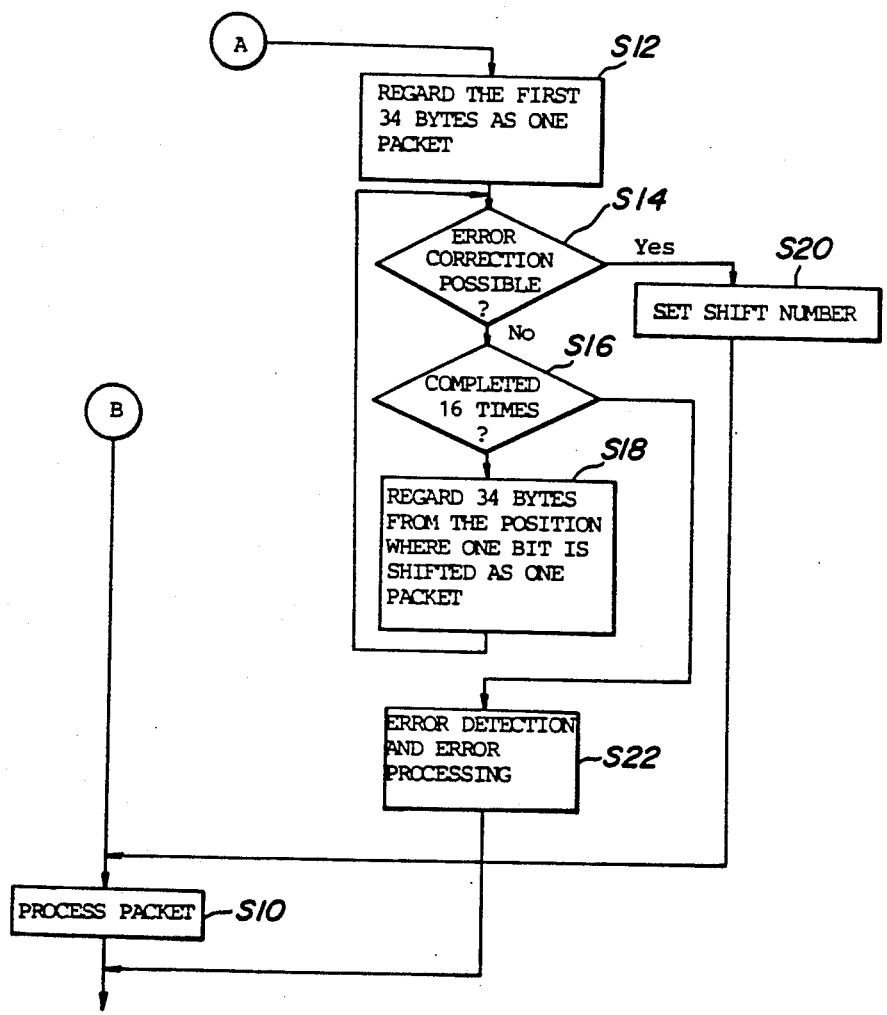

FIGS. 36A and 36B show a flowchart explaining the packet signal error correction procedure described above. That is, if error correction has not been made after 16 shifts, it is handled as an error detection. The steps of the flowchart as shown in FIGS. 36A and 36B are as follows:

Step S2: Load 36 bytes.
Step S4: The number of shifts has been already determined?
Step S6: In response to a predetermined shift number, 34 bytes are constructed into one packet.
Step S8: Error correction possible?
Step S10: Packet processing.
Step S12: The leading 34 bytes are regarded as one packet.
Step S14: Error correction is possible?
Step S16: The shifts of 16 times have been made?
Step S18: 34 bytes are regarded as one packet, after one bit has been shifted.
Step S20: Set the number of shifts.
Step S22: The process of the error detection and error correction.

Figure 37:
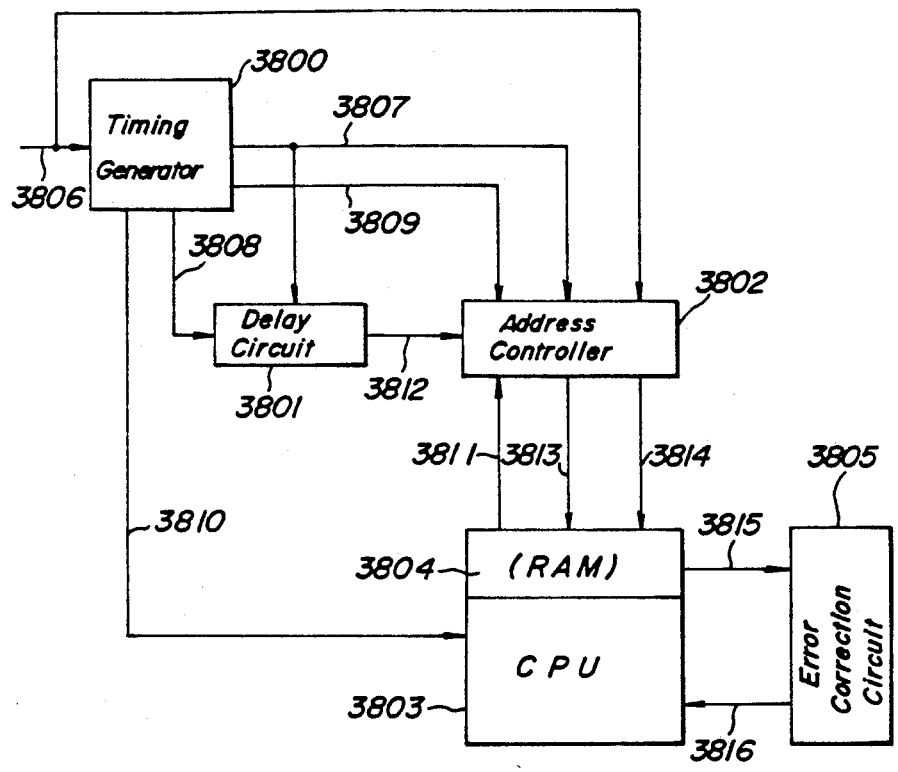
FIG. 37 is a block diagram showing a signal fetching circuit in accordance with the present invention.

FIG. 37 shows a signal loading circuit for this embodiment. Reference numeral 3800 denotes a timing generator; 3801, a delay circuit; 3802, an address controller; 3803, a CPU; 3804, a RAM in the CPU 3803; 3805, an error correcting circuit; 3806, a character code multiplexed signal; 3807, a clock signal; 3808, a line gate signal; 3809, a line code signal; 3810, a DMA request signal; 3811, a DMA grant signal; 3812, a write timing signal for character code; 3813, an address signal; 3814, a write control signal; 3815, an error correction control signal and a packet signal to be corrected; and 3816, an error correction status signal and an error corrected packet signal.

It has been known, that even if the character code broadcasting is multiplexed during the 10H through 21H vertical blanking period, the picture display of the conventional television broadcasting is not adversely affected. Therefore, in practice, effecting the multiplexed transmission of character code signal during 30H through 21H may be considered. The above-described the DMA request signal 3810 is used for directly writing the multiplexed character code signal into the RAM 3804 within the CPU. It is preferable that the timing is set on about the nineth line.

When the CPU 3803 receives the DMA request signal 3810, the CPU outputs DMA grant signal 3811 to the address controller 3802, so that the RAM 3804 is controlled by the address controller 3802.

The line gate signal is a gate signal on a line, where a character code signal is superposed, and its rising timing is independent of the phase of the clock signal 3807. In general, the line gate signal 3808 includes a jitter component caused by some notes. In order to eliminate the adverse effect of the jitter, the delay circuit 3801 is so adjusted that the phase of the line gate signal 3808 coincides with the midpoint of the phase of the clock signal 3807. That is, since the clock signal 3807 has the frequency of 5.73 MHz, the line gate signal 3808 is set to the phase of $+175/2$ ns. Therefore, deviation of the phase of the line gate signal 3808 for each H can be prevented. In response to the gate signal 3812, which has no phase jitter in each H, the operation of the address controller 3802 is started.

In response to the line number of the line code signal 3809, the start address of the address controller 3802 is identified. Starting from this start address, data 3806 each consisting of 8 bits are stored in the RAM 3804. The address signal 3813 and the write control signal 3814 are used to control the RAM 3804.

The above-described operation is carried out for each line. The CPU 3803, which has received the whole multiplexed signal, carries out the above-described operation (cf. FIG. 36) for each packet signal. Since the error correction control signal, the packet signal 3815 to be corrected, the error correction status signal and the error corrected packet signal 3816 are irrelevant to this embodiment, no detailed explanation shall be made in this specification.

The signal loading circuit as shown in FIG. 37 can eliminate the detecting circuit for the framing signal. That is, for each field, the contents of the RAM 3804 are all reset to "0", so that whether or not each line has a multiplexed signal is identified. Because, only when the clock line signal 3102 exists, the line gate signal 3808 is delivered. Alternatively, the same object can be attained by setting an information which represents that whether or not there exists the clock-run-in signal for each H, thereafter by reading out the data from the register.

Figure 38:
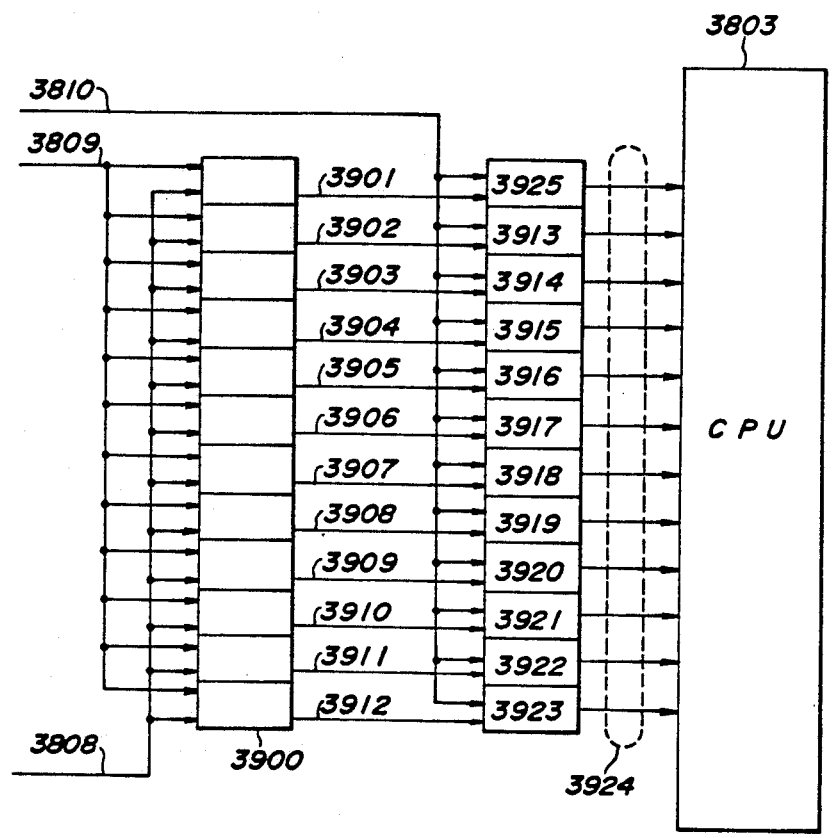
FIG. 38 is a block diagram showing an embodiment of a circuit for detecting whether a clock-run-in signal is present or absent.

FIG. 38 shows an embodiment of a circuit for detecting whether or not the clock-run-in signal exists. In other words, FIG. 38 shows a practical hardware construction, used in a system in which the clock-run-in signal for each H is detected, by causing the CPU 3803 to read the data from the register. Reference numeral 3900 denotes a line address decoder; 3901 through 3912, a clock-run-in present signal regarding the 10H through 21H line; 3925 and 3913 through 3923, registers for displaying whether the clock-run-in signal is present or absent regarding the 10H through 21H line; and 3924, an input signal to an input port of the CPU 3803.

In response to the DMA request signal 3810, the registers 3925 and 3913 through 3923 are all cleared to 0. Next, the contents of the line code signal 3809 are decoded by the address decoder 3900, and the line gate signal 3808 is divided into the signals 3901 through 3912, in response to each timing when the clock-run-in signal is present. Therefore, the registers 3925 and 3913 through 3923 are all set to "1". "0" shows that clock-run-in signal is absent, while "1" shows that clock-run-in signal is present. Therefore, when the CPU 3803 reads the data from the input port, the CPU can immediately identify which line carries the superposed data.

The second embodiment of the framing timing detection circuit will be described.

In the first embodiment described above, a correct shift number is uniformly determined, and based upon this shift number; that is, by using this shift number as a reference, a correct phase is detected. According to such system, if data is set for each H in different phase, it has no meaning at all. Therefore, an improvement of the first embodiment is provided. That is, there is provided a system in which the correct phases are memorized for each H. In this case, the control procedure is substantially similar to that described above with reference to FIG. 36. But, the step S4 in FIG. 36 should read from "the shift number" to "the optimum shift number of the received H". Further, the Step S20 should read "Set to the optimum shift number of the received H".

Finally, the third embodiment of the framing timing circuit will be described.

If it is impossible to effect the error correction with a predetermined shift number, it is possible to determine swiftly a desired shift number, by improving an algorithm for retrieving a correct shift number.

Figure 39:
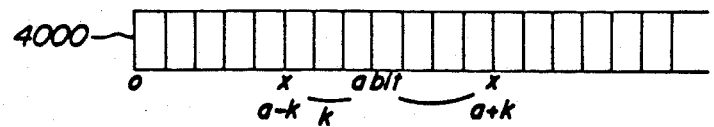
FIG. 39 is a diagram showing an example of a 36 byte data stored in a RAM of a CPU.

FIG. 39 shows a 36-byte data stored in the RAM of the CPU. Reference numeral 4000 denotes a 36-byte packet signal. The point "a" indicates a framing timing, which has been determined in the previous step. "k" is a variable for sequentially varying, and "X" indicates a framing timing presumed at its time point. Tests are made with $$x = a + k$$

where, $a \leq x \leq 15$. It has no meaning, if x exceeds this range. A correcting framing time is retrieved, by shifting to the right and left about the point "a".

Figure 40:
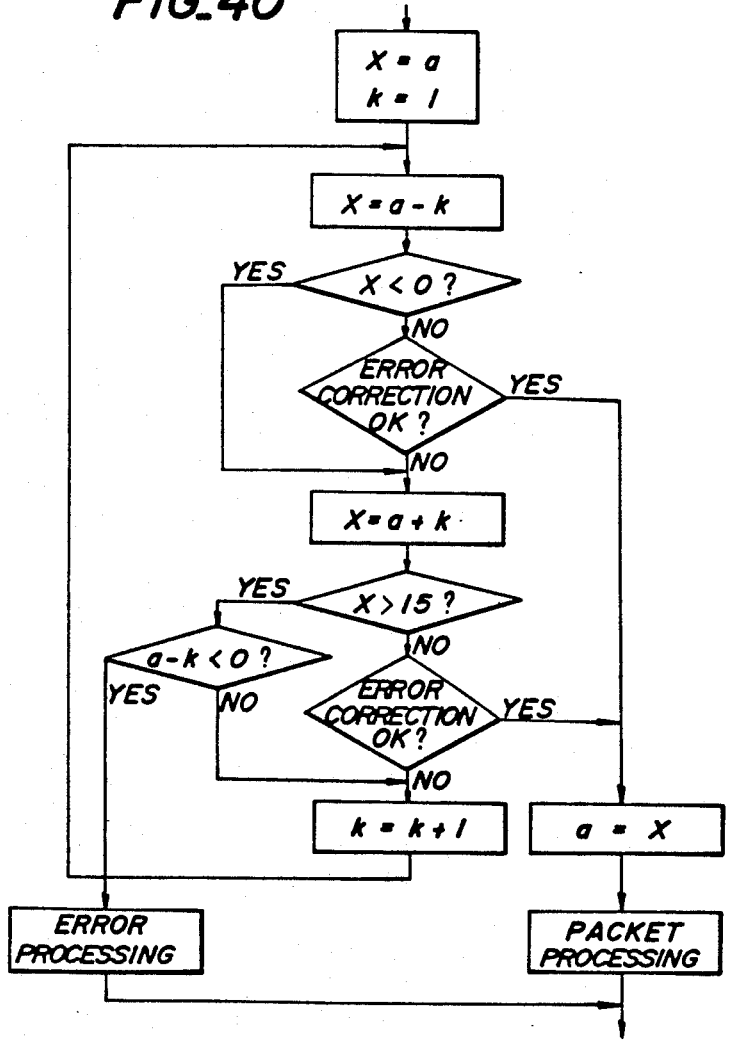
FIG. 40 is a flowchart showing an example of a practical framing phase retrieval procedure to be used in the present invention.

FIG. 40 shows the flowchart used to explain the framing phase retrieving procedure. Each step is apparent from FIG. 40, so that no detailed description shall be made in this specification.

As described in detail above, according the framing timing detection circuit in accordance with the present invention, a framing timing extraction circuit and a phase lock circuit for the framing timing can be eliminated, so that the amount of hardware is reduced. Furthermore, since the framing timing detecting ability is based on the (272,190) error correction system, the ability is considerably improved as compared with the conventional 8-bit framing code system.

In the systems described in conjunction with the first, second and third embodiments of the framing timing detection circuit, the superposed PN signal (that is, Exclusive-ORed signal) has been described as consisting of 255 bits (cf. FIG. 32), but it is apparent that the same effect can be also attained by adding the first portion of the same PN signal to it, and superposing the PN signal over the remaining portion. In this case, the PN signal to be added consists of 33 bytes=264 bits. As described above, the 8-bit PN signal that has a period of 255 bits is used, but it is apparent that the same effect can be obtained by using 9 or 10 bits.

According to the present invention, if the framing timing is wrong, in almost all cases, the packet signal error correcting circuit represents that it is impossible to correct errors. Thus, it is possible to find a framing timing, without the use of a framing timing extraction circuit based on a framing code.

According to the first embodiment of the framing timing detection circuit, the data is loaded on the timing, which is earlier than 8 bits with regard to the normal framing timing phase, then by considering the whole data as consisting of 36 bytes, and by shifting the framing timing one bit by one bit. Thus, found timing is stored and, in the next step, in response to the stored framing timing, a packet signal is restored. As a result, there is an advantage that a load of CPU can be decreased.

According to the second embodiment of the framing timing detection circuit, a system is employed in which the framing timing obtained in accordance with the first embodiment is stored for each H. Therefore, there is the advantage that the errors of a packet signal can be corrected within the shortest time period, even if the multiplexed phases are different for each line.

According to the third embodiment of the framing timing detecting circuit, when the error correction is impossible with a predetermined framing timing, a framing timing is searched from the vicinity of a predetermined framing phase whose error correction is impossible. As a consequence, a framing timing can be searched within the shortest time period.

As described above, it has been considered that the shortened error correcting code has the length of 272 bits (i.e. 34 bytes). Alternatively, any kind of error correcting code that is to be shortened to a desired code length can be used. In other words, after selecting a random multi-error correcting code having a maximum length block in a packet, the random multi-error correcting code is shortened by n (n=1, 2, ...) bits. For instance, in the case of 33 bytes (i.e. 264 bits) as its code length, the (264,182) code is used. Therefore, the data register described in the embodiments requires a length of 182 bits, and then the idle operation is repeated nine times using the syndrome register to shorten nine bits at the time of load-ending. In this case, if the orthogonal parity check sums are constructed so that the ninth bit from the leading bit is orthogonal, it is apparent that the nine-bit idle operation of the syndrome register is required by all means.

What is claimed is:

1. A framing timing detection circuit for use in a character code broadcasting system, comprising:
   first means for receiving a transmitted signal in which a pseudo random signal has been added to a packet signal for the character code broadcasting system;
   second means for fetching a signal which includes the received packet signal and signals adjacent to the leading and trailing ends of the received packet signal, the fetched signal being loaded into the second means;
   third means for executing a predetermined logical operation on said signal loaded into said second means; and
   fourth means for shifting a specific time point of said signal loaded into said second means by one bit sequentially and for detecting a framing timing.

2. A framing timing detection circuit as claimed in claim 1, wherein prior to transmission said pseudo random signal is added to said packet signal by exclusively OR-ing said pseudo random signal and a portion of said packet signal succeeding a predetermined time point of said packet signal, and wherein said third means comprises means for executing an exclusive OR operation between said pseudo random signal and said signal loaded into said second means in the portion succeeding to said predetermined time point of the signal loaded into said second means.

3. A framing timing detection circuit as claimed in claim 1, wherein on the transmission side said transmitted signal is formed by adding said pseudo random signal to the signal obtained by removing four bytes of a clock-run-in signal, a framing code signal, a service discriminating signal and an interrupt signal from said packet signal for character code broadcasting, wherein on the receiving side said received packet signal consists of 34 bytes, and each of said signals adjacent to the leading and trailing ends of said received packet signal is substantially one byte, and wherein said fourth means comprises means for sequentially shifting the leading bit of the received signal to form one packet signal, and a (272,190) error correction circuit for effecting error correction of said one packet signal in such a manner that a timing at which the error of said one packet signal is corrected is determined and used as the framing timing.

4. A framing timing detection circuit as claimed in claim 3, wherein said fourth means further includes means for storing said shift number already determined, means for determining said packet signal in response to said determined shift number and means for loading said packet signal into said (272,190) error correction circuit.

5. A framing timing circuit as claimed in claim 4, wherein said means for storing stores the number of shifts which has been already determined per one horizontal scan, and further comprising means for detecting the framing timing even when the phases of the transmitted signals are varied in respective horizontal scans.

6. A framing timing detection circuit as claimed in claim 5, further comprising means for determining said framing timing within a minimum time period in response to a predetermined algorithm, in the case that the errors of a packet signal are not corrected by a predetermined number of shifts.

7. A framing timing detection circuit as claimed in claim 1, further comprising fifth means for retrieving a timing at which the number of error bits is minimized.

8. A framing timing detection circuit for use during reception of a transmitted signal which includes a modified packet signal formed prior to transmission by combining a pseudo random signal and a packet signal having character information bits and error correction bits, the modified packet signal having leading and trailing ends, comprising:

first means for storing the received modified packet signal and further signals fetched at the outside of the leading and trailing ends thereof;

second means for executing a predetermined logical operation on a predetermined portion of the signal stored in the first means;

third means for sequentially shifting by one bit the predetermined portion of the signal stored in the first means on which the predetermined logical operation is executed; and fourth means for determining, during the shifting, when the number of error bits is minimized.

9. A framing timing detection circuit as claimed in claim 8, wherein said pseudo random signal has a plurality of bits, and wherein said second means comprises means for exclusively OR-ing bits of said pseudo random signal and bits of the predetermined portion of the signal stored in said first means.

10. A framing timing detection circuit as claimed in claim 8, wherein on the transmission side said packet signal and modified packet signal each consist of 34 bytes, and wherein the fourth means comprises a (272,190) error correction circuit.

11. A framing timing detection circuit as claimed in claim 10, further comprising means for storing the number of one bit sequential shifts by the third means until the fourth means retrieves the timing at which the number of bit errors is minimized, and means for thereafter identifying a received modified packet signal on the basis of the stored shift number.

12. A framing timing circuit as claimed in claim 11, further comprising means for storing the number of shifts which has been already determined per one horizontal scan, so that the framing timing is detected even when the phases of the transmitted signals are varied in respective horizontal scans.

13. A framing timing detection circuit as claimed in claim 12, further comprising means for determining a framing timing within a minimum time period in response to a predetermined algorithm if the errors of a received modified packet signal are not corrected by a predetermined number of shifts.

* * * * *